US 9,244,546 B2

(12) United States Patent
Mimura et al.

(10) Patent No.: US 9,244,546 B2
(45) Date of Patent: Jan. 26, 2016

(54) IMAGE DISPLAY DEVICE, ELECTRONIC APPARATUS USING THE SAME, DISPLAY OUTPUT CONTROL METHOD FOR IMAGE DISPLAY DEVICE, AND OUTPUT CONTROL PROGRAM THEREOF

(75) Inventors: Koji Mimura, Kanagawa (JP); Ken Sumiyoshi, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 1088 days.

(21) Appl. No.: 13/164,376

(22) Filed: Jun. 20, 2011

(65) Prior Publication Data

US 2011/0310085 A1    Dec. 22, 2011

(30) Foreign Application Priority Data

Jun. 21, 2010   (JP) .................................. 2010-141024
Mar. 10, 2011   (JP) .................................. 2011-052914

(51) Int. Cl.
G02F 1/13      (2006.01)
G09G 3/36      (2006.01)
G01R 31/02     (2006.01)
G06F 3/041     (2006.01)

(52) U.S. Cl.
CPC .............. *G06F 3/041* (2013.01); *G02F 1/1323* (2013.01); *G01R 31/024* (2013.01); *G09G 3/3603* (2013.01); *G09G 2320/028* (2013.01)

(58) Field of Classification Search
CPC . G02F 1/132; G02F 1/1323; G02F 1/133504; G09G 3/36; G09G 3/3603; G09G 2320/028; H02H 3/04; G01R 31/025; G01R 31/024
USPC ....................................... 345/87, 211; 359/43
See application file for complete search history.

(56) References Cited

U.S. PATENT DOCUMENTS

| 3,886,932 | A | * | 6/1975 | Suessmilch | .......... | H02H 1/0007 |
| | | | | | | 128/908 |
| 4,093,355 | A | * | 6/1978 | Kaplit | ............... | G02F 1/133382 |
| | | | | | | 219/209 |
| 4,763,992 | A | * | 8/1988 | Takada | .............. | G02F 1/133382 |
| | | | | | | 349/161 |
| 5,066,104 | A | * | 11/1991 | Mohebban | ............ | G02F 1/1313 |
| | | | | | | 324/501 |
| 5,548,420 | A | * | 8/1996 | Koshimizu | .............. | G02F 1/132 |
| | | | | | | 349/168 |
| 5,877,829 | A | * | 3/1999 | Okamoto et al. | ............... | 349/74 |

(Continued)

FOREIGN PATENT DOCUMENTS

JP    11-231794 A     8/1999
JP    2006-323031 A   11/2006

(Continued)

*Primary Examiner* — Matthew Fry
(74) *Attorney, Agent, or Firm* — Sughrue Mion, PLLC

(57) ABSTRACT

Provided is a display device having a viewing angle changing function, which is capable of preventing leakage of information displayed on a display screen even when there is a fault generated in changing the viewing angle. The image display device including a viewing angle changing element capable of changing a wide vision display and a narrow vision display and including a display element is provided with a detection element which detects a fault generated in the viewing angle changing element and a module for changing to a narrow vision display when there is a fault based on a detection value of the detection element. For example, when there is a fault, a transparent heater is operated to heat a liquid crystal layer to set a transparent-scattering changing element to a transparent state and forcibly set the display device to a narrow vision display.

5 Claims, 24 Drawing Sheets

(56) References Cited

U.S. PATENT DOCUMENTS

| | | | |
|---|---|---|---|
| 5,936,696 A * | 8/1999 | Daijogo | G02F 1/133382 219/497 |
| 6,529,676 B2 * | 3/2003 | Eggleton et al. | 385/142 |
| 7,317,436 B2 * | 1/2008 | Lee et al. | 345/87 |
| 7,570,320 B1 * | 8/2009 | Anderson | G02F 1/1326 349/61 |
| 7,639,332 B2 * | 12/2009 | Miyachi | G02F 1/137 349/129 |
| 2004/0113569 A1 * | 6/2004 | Henry | H05B 41/2822 315/307 |
| 2005/0041020 A1 * | 2/2005 | Roes | G02F 1/1334 345/211 |
| 2005/0151912 A1 * | 7/2005 | Miyachi | G02F 1/133753 349/141 |

FOREIGN PATENT DOCUMENTS

| | | |
|---|---|---|
| JP | 2007-233373 A | 9/2007 |
| JP | 2007-298844 A | 11/2007 |

* cited by examiner

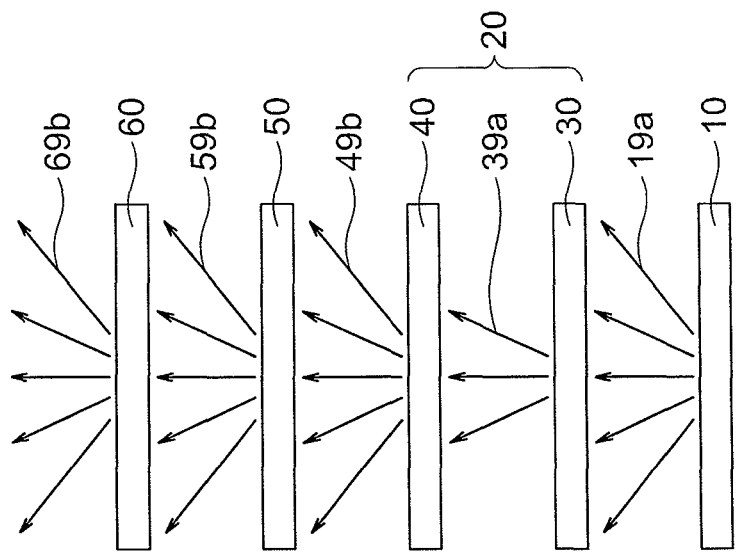
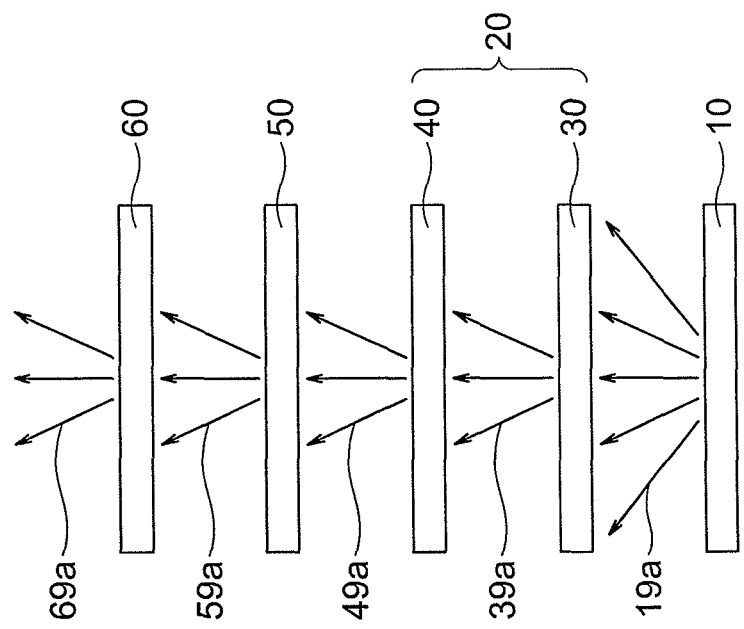

FIG. 4

| STATE OF TRANSPARENT-SCATTERING CHANGING ELEMENT | FAULT MODE 1 | FAULT MODE 2 | FAULT MODE 3 | FAULT MODE 4 |
|---|---|---|---|---|
|  | ABNORMAL VOLTAGE (<THRESHOLD VALUE) | OPEN | SHORT-CIRCUIT | ABNORMAL VOLTAGE (>THRESHOLD VALUE) |
| DISPLAY DEVICE | SCATTERING STATE | SCATTERING STATE | SCATTERING STATE | TRANSPARENT STATE |
|  | WIDE VISION DISPLAY | WIDE VISION DISPLAY | WIDE VISION DISPLAY | NARROW VISION DISPLAY |
| DETECTION ELEMENT (LUMINANCE VALUE) | >SET VALUE | >>SET VALUE | >>SET VALUE | =SET VALUE |

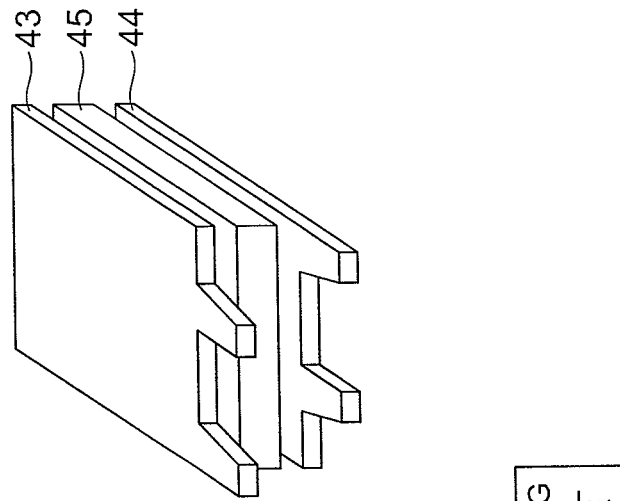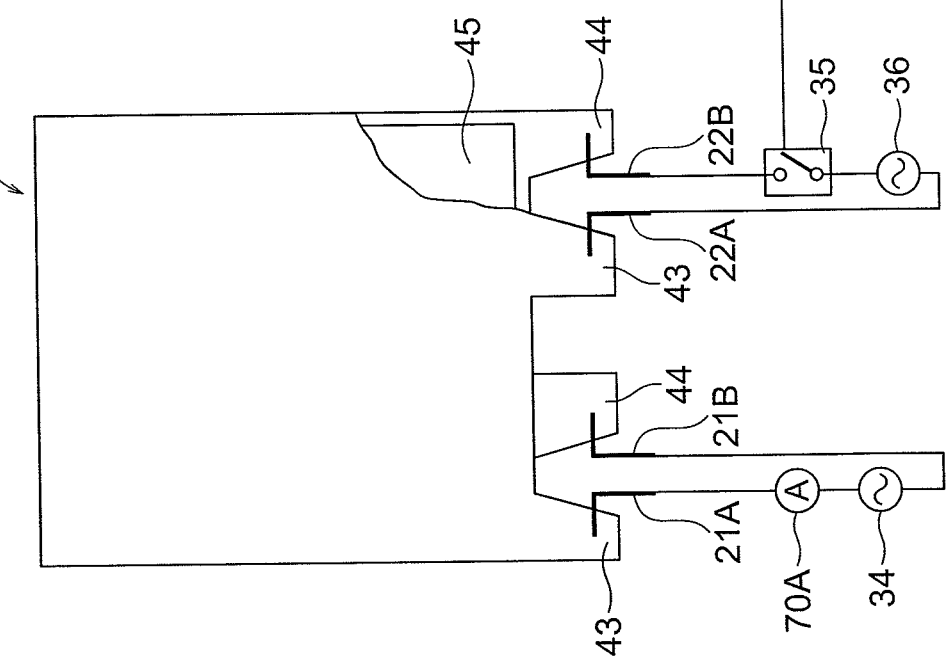

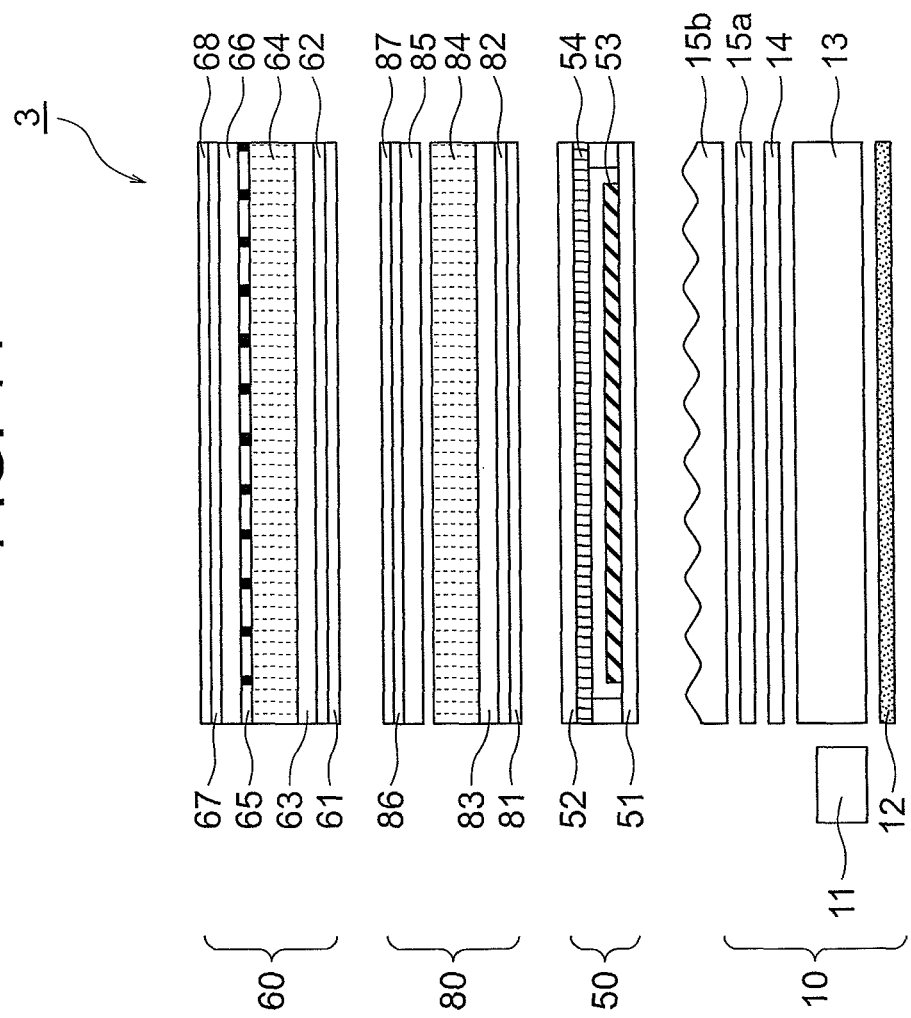

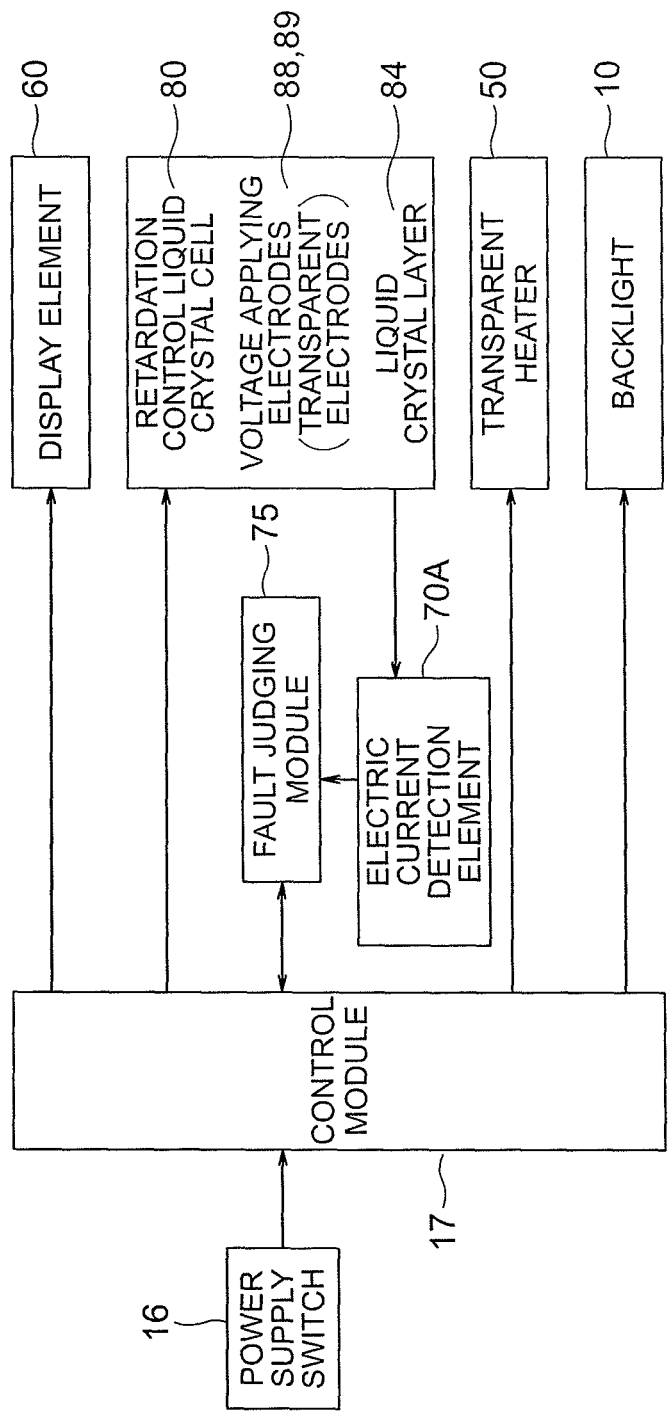

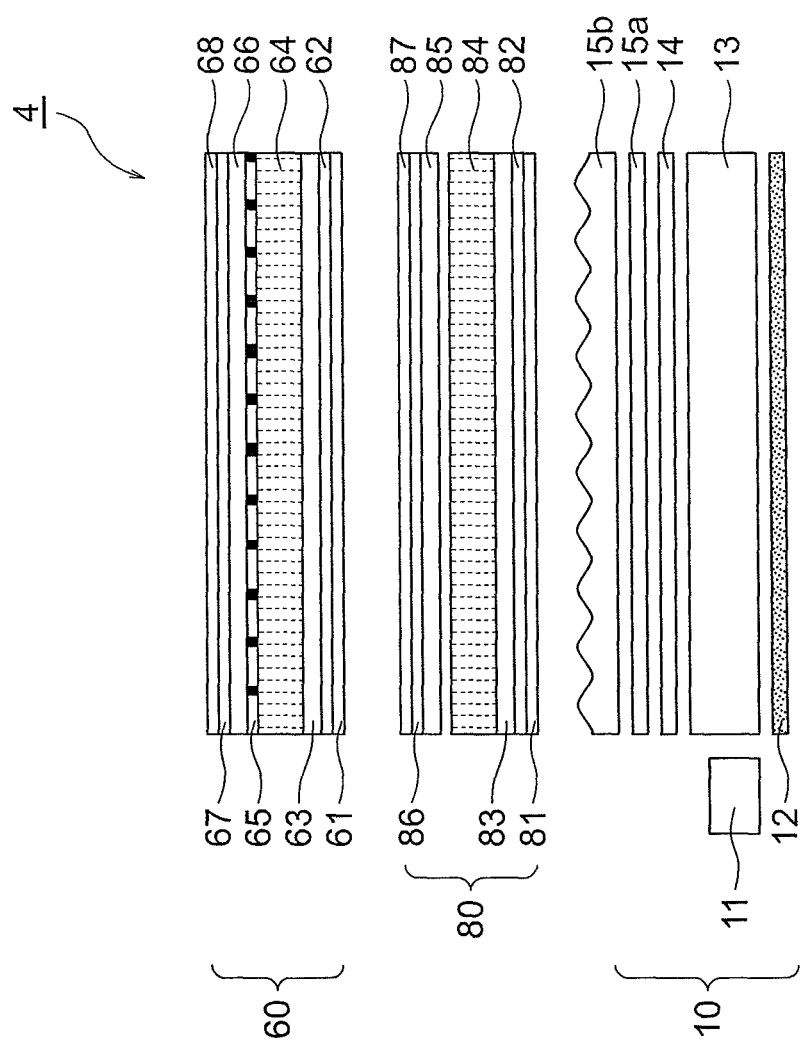

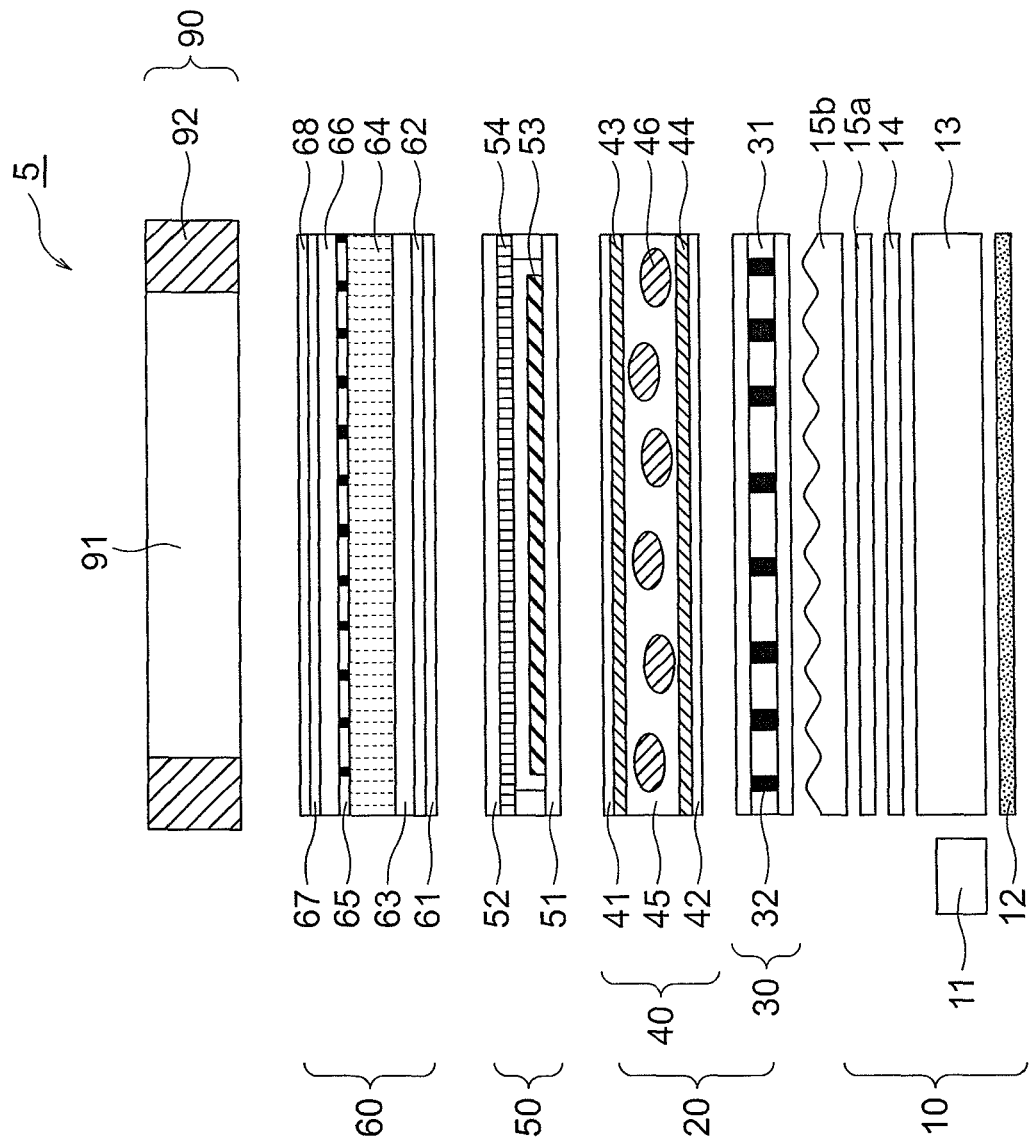

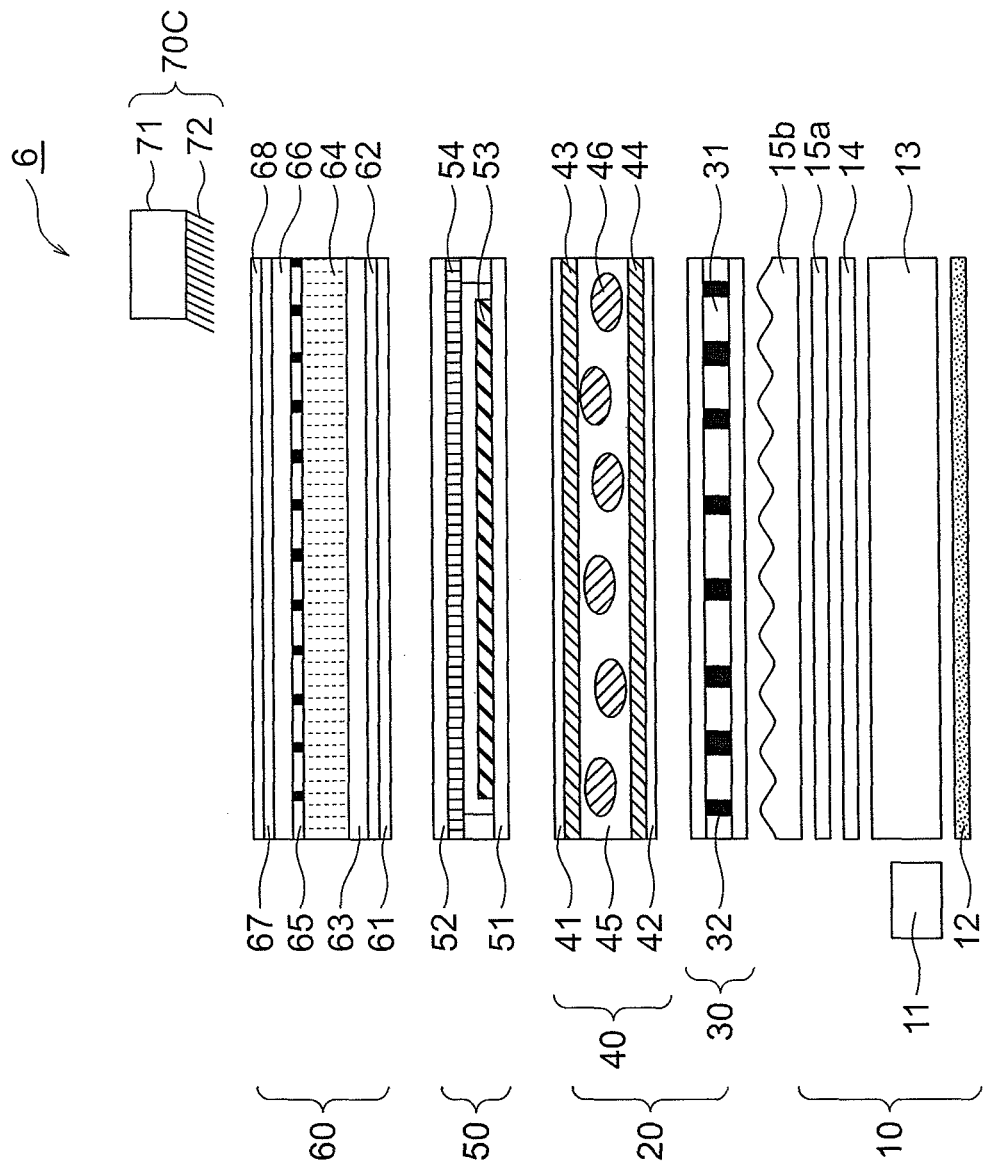

# IMAGE DISPLAY DEVICE, ELECTRONIC APPARATUS USING THE SAME, DISPLAY OUTPUT CONTROL METHOD FOR IMAGE DISPLAY DEVICE, AND OUTPUT CONTROL PROGRAM THEREOF

CROSS-REFERENCE TO RELATED APPLICATIONS

This application is based upon and claims the benefit of priority from Japanese patent application No. 2010-141024, filed on Jun. 21, 2010, and Japanese patent application No. 2011-052914, filed on Mar. 10, 2011, the disclosure of which is incorporated herein in its entirety by reference.

BACKGROUND OF THE INVENTION

1. Field of the Invention

The present invention relates to an image display device capable of changing a wide vision display and narrow vision display, an electronic apparatus using the same, a display output control method for the image display device, and an output control program thereof.

2. Description of the Related Art

Recently, liquid crystal displays (LCDs) are broadly used for display elements of general-use display devices such as mobile phones and notebook personal computers as well as display elements of ATMs (Automatic Teller Machines) and industrial information terminal devices used in convenience stores and the like. Due to the technical developments achieved heretofore, the LCD has no viewing-angle dependency, and the display thereof can be visually recognized from every direction. While the mobile terminals such as the mobile phones and the notebook personal computers are normally used with a wide vision display, there are many opportunities to display personal information and secret information thereon in public places because of their nature as the terminals. Under such circumstances, there is a demand to limit the viewing angle so as not be peeped by others. Further, with ATMs and the information terminal devices placed in convenience stores and the like, the viewing angle of the display elements are limited by providing a viewing-angle limiting film on top of the display elements for the sake of privacy protection and information security.

In the meantime, there is a demand to use such information terminal devices as advertisement media by setting those to a wide viewing angle display when no one is using the devices.

As described, there has been an increasing demand for making it possible to change the viewing angles of the display devices depending on the use conditions thereof regarding various kinds of display devices.

For such demands, Japanese Unexamined Patent Publication Hei 11-231794 (paragraphs [0018]-[0020] (Patent Document 1)), for example, proposes a display technique which is capable of changing viewing angles. This technique will be described hereinafter by referring to FIG. 24. As shown in FIG. 24, a diffusion device 103, luminance enhancement films 104 and 105, a unit 110 formed with a louver film which restricts the spread angles of light, a variable diffusion cell 111, and an LCD screen 106 are placed on a backlight system constituted with a line of fluorescent lights 101 and a mirror 102 in a sequentially stacked manner.

The variable diffusion cell 111 can change a transparent state and a light scattering state by applying or not applying an electric field. As the cell, a polymer dispersed liquid crystal cell or a polymer stabilized cholesteric structure cell can be used. Through changing the transparent state and the light scattering state of the variable diffusion cell 111 electrically, it is possible to change the narrow vision display with which the display can be viewed only from a narrow angle range and the wide vision display with which the display can be recognized from a wide angle range.

Further, as other related techniques, there are Japanese Unexamined Patent Publication 2006-323031 (Patent Documents 2), Japanese Unexamined Patent Publication 2007-233373 (Patent Documents 3), and Japanese Unexamined Patent Publication 2007-298844 (Patent Documents 4).

Among those, Patent Document 2 discloses a display device which includes: a surface light source which emits light on a plane towards the viewer side; a viewing angle control module provided in front of the surface light source for increasing the directivity of transmission light; a changing element provided on the front face of the viewing angle control module, which is adhesively attached via an adhesive layer; and a display panel provided in front of the changing element. Among those, the changing element changes to a transparent state where incident light is transmitted as it is or to a semitransparent opaque state where the incident light is let through by being scattered.

Further, Patent Document 3 discloses a display device capable of changing the viewing angle range, which includes: a light source device that is provided with a transparent-scattering changing element capable of changing a state for transmitting incident light and a state for scattering the incident light; and a transmission-type liquid crystal display panel including pixels for display arranged in matrix, which drives the transparent-scattering changing element by using a power supply and signals for driving the pixels.

Furthermore, Patent Document 4 discloses a display device which is constituted with: a lighting angle variable light source device formed with a backlight functioning as a light source and a light beam control device; and a transmission type display device. The light beam control device is provided with a transparent-scattering element capable of electrically changing straightforward emission and scattering emission of incident light, which is stacked on a light beam control film device.

However, in the variable viewing angle display technique disclosed in Patent Document 1, there is such a shortcoming that no measure is taken for a fault that may occur in changing the viewing angles. That is, there is a possibility of causing leakage of screen information when the screen turns to the wide vision display because of a fault when it is intended to be used as the narrow vision display. Particularly, with the information terminals device such as the ATM where it is important to keep the security of the display information, such fault can become a fatal event that may lose the reliability for the customers.

Further, since there is also no measure for a fault in changing the viewing angles taken in the display devices disclosed in Patent Documents 2, 3, and 4, there is a possibility leaking screen information when the screen turns to the wide vision display because of a fault when it is intended to be used as the narrow vision display.

The present invention is designed in view of such circumstances, and it is an exemplary object of the present invention to provide an image display device which can prevent leakage of information displayed on the display screen even when there is a fault generated in the viewing angle changing function, and to provide an electronic apparatus using the same, a display output control method for the image display device, and an output control program thereof.

SUMMARY OF THE INVENTION

In order to overcome the foregoing issues, the image display device according to an exemplary aspect of the invention is characterized as an image display device, including a display device main body which includes a display element for outputting/displaying prescribed information to outside and a viewing angle changing element for setting to change outputted display of image information on the display element at least from a wide vision display to a narrow vision display based on a changing command from the outside, wherein: the display device main body is provided with an operation state detection element which detects an operation state of the viewing angle changing element; and the viewing angle changing element is provided with a narrow vision forcible setting module which operates to forcibly set the outputted display of the display element to a narrow vision display state, when the operation state detected by the operation state detection element is a fault state.

Further, in order to overcome the foregoing issues, the electronic apparatus according to another exemplary aspect of the invention is characterized to include the above-described image display device loaded for displaying information.

Furthermore, in order to overcome the foregoing issues, the display output control method for the image display device according to still another exemplary aspect of the invention is characterized as a method used for an image display device including a display device main body which includes a display element for outputting/displaying prescribed image information to outside and a viewing angle changing element for setting to change outputted display of image information on the display element at least from a wide vision display to a narrow vision display based on a changing command from the outside, and the method includes: detecting an electric current flowing into the viewing angle changing element by an electric current detection element provided to the display device main body; executing comparison processing for comparing the electric current value detected by the electric current detection element with an electric current value under a normal operation measured and stored in advance, and judgment processing by a fault judging module provided to the display device main body for judging whether or not there is a fault generated in the viewing angle changing element based on a result of the comparison; and setting the output display of the display element to a narrow vision display state forcibly by a narrow vision forcible setting module that is provided to the viewing angle changing element, when it is judged by the fault judging module that there is a fault.

Moreover, in order to overcome the foregoing issues, the display output control program for the image display device according to still another exemplary aspect of the invention is characterized as a program used for an image display device including a display device main body which includes a display element for outputting/displaying prescribed image information to outside and a viewing angle changing element for setting to change outputted display of image information on the display element at least from a wide vision display to a narrow vision display based on a changing command from the outside, and the program causes a computer to execute: a fault judgment processing function which compares an electric current value detected by an electric current value detection element for detecting a drive electric current for the viewing angle changing element with an electric current value under a normal operation stored in advance, and judges whether or not there is a fault generated in the viewing angle changing element based on a result of the comparison; and a narrow vision forcible changing function which forcibly sets the display of the display element to a narrow vision display state, when it is judged by the fault judgment processing function that there is a fault.

BRIEF DESCRIPTION OF THE DRAWINGS

FIGS. 2A and 2B show schematic illustrations of the spread of light at the time of changing the viewing angle executed in the image display device shown in FIG. 1, in which FIG. 2A is a narrow vision display operation and FIG. 2B is a wide vision display operation;

FIG. 4 is a table showing fault modes and states of a viewing angle changing element of the image display device shown in FIG. 1;

FIG. 12A is a plan view of a transmission-scattering changing element of an image display device according to a third exemplary embodiment of the present invention, and FIG. 12B is a perspective view thereof;

FIG. 14 is a sectional view showing a fifth exemplary embodiment of the image display device according to the present invention;

FIG. 15 is a block diagram showing a drive control system of the image display device shown in FIG. 14;

FIG. 16 is a sectional view showing a sixth exemplary embodiment of the image display device according to the present invention;

FIG. 17 is a sectional view showing a seventh exemplary embodiment of the image display device according to the present invention;

FIG. 18 is a sectional view showing an eighth exemplary embodiment of the image display device according to the present invention;

FIGS. 19A and 19B are illustrations of an oblique louver provided to the image display device shown in FIG. 18, in which FIG. 19A is a sectional view showing the main part thereof and FIG. 19B shows a function of the oblique louver shown in FIG. 19A;

DETAILED DESCRIPTION OF THE PREFERRED EMBODIMENTS

First Exemplary Embodiment

Figure 1:
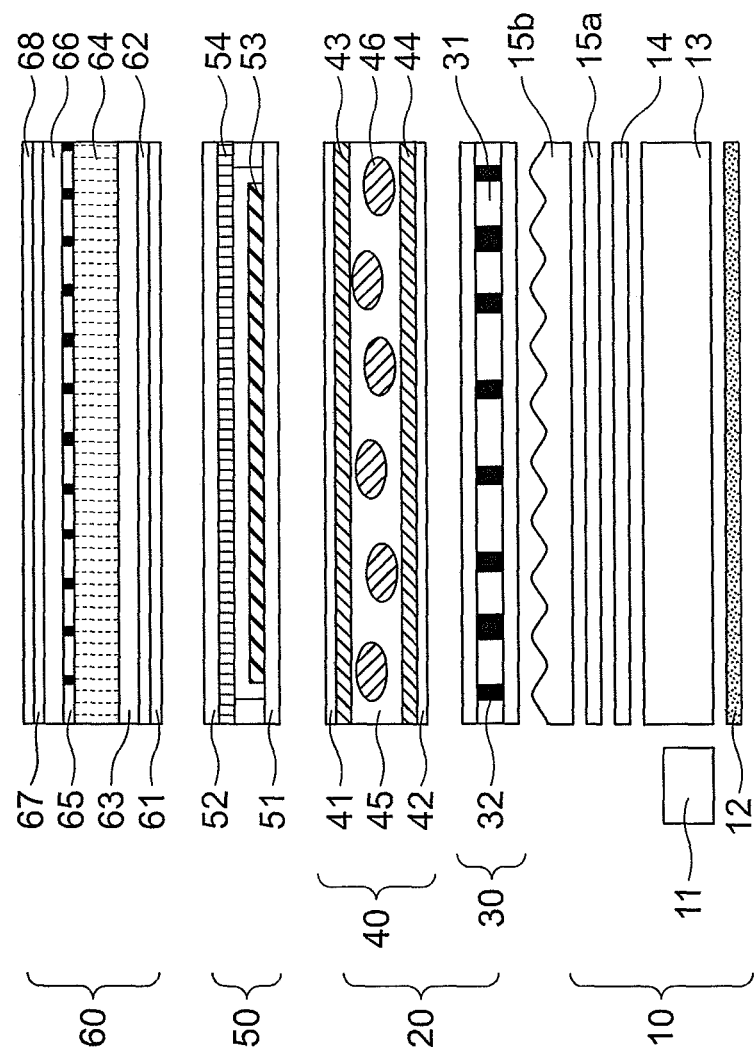
FIG. 1 is a sectional view showing a first exemplary embodiment of an image display device according to the present invention.

Hereinafter, a first embodiment of an image display device according to the present invention will be described by referring to FIG. 1-FIG. 7. As shown in FIG. 1, an image display device 1 is formed by including at least: a backlight 10 functioning as a surface light source; a viewing angle changing element 20 provided on the upper side of the back light 1, which is capable of electrically changing the viewing angle range (narrow vision field and wide vision field) of the image display device 1; a transparent heater 50 provided on the upper side of the viewing angle changing element 20 for heating the viewing angle changing element 20; and a non-luminous type display element 60 provided on the upper side of the transparent heater 50.

Further, although not shown in FIG. 1, in addition to those, the image display device 1 is provided with a detection element (operation state detection element) 70A (see FIG. 6) for monitoring the state of the viewing angle changing element 20 and with a fault judging module 75 (see FIG. 6) for judging whether or not there is a fault generated the viewing angle changing element 20 based on a detection measurement value (or a detection signal) of the detection element. Thus, while the illustration of FIG. 1 only corresponds to the main part of the image display device, the illustration shown in FIG. 1 is simply considered as the image display device 1 in the explanations provided hereinafter for easy understanding.

Among the above-described structures, the backlight 10 is formed by including at least: a light source 11 formed as a linear light source by lining a plurality of light sources made with a cold cathode tubes or point light sources (e.g., LED (Light Emitting Diode)) in a straight line; a light guiding plate 13 for making the light radiated from the light source 11 into a surface light source; a reflection sheet 12 which reflects the light leaked from the light guiding plate 13 so that the light makes incident again to the light guiding plate 13; a diffusion plate 14 for uniformanizing the luminance within the display surface by diffusing the light emitted from the light guiding plate 13 towards the display element 60 side; and prism sheets 15a and 15b for increasing the front luminance of the display element 60 by increasing the directivity of the light emitted from the diffusion plate 14.

Further, although not shown in FIG. 1, in addition to those, a reflection type polarization film may be provided on top of the prism sheets 15a and 15b for improving the front luminance of the display element 60. A specific example of the reflection type polarization film may be DBEF (Dual Brightness Enhancement Film) that is a product of Sumitomo 3M Corporation.

Furthermore, the form of the backlight 10 is not limited to the one described above but may be any form, as long as it is a surface luminance type light source that can be utilized as a surface light source of the non-luminous type display element 60.

As shown in FIG. 1, the viewing angle changing element 20 is formed by including: a micro louver 30 in which a transparent layer 31 and a light shielding layer 32 are alternately disposed; and a transparent-scattering changing element 40 which changes alignment of liquid crystal molecules to a transparent state and a scattering state. Through electrically changing the transparent-scattering changing element 40 to the transparent state and the scattering state, the image display device 1 can be set to a narrow vision display state and a wide vision display state. The transparent-scattering changing element 40 is formed by including: a pair of transparent substrates 41 and 42; transparent electrodes (voltage applying electrodes) 43 and 44 formed on the transparent substrates; and a polymer dispersed liquid crystal or a polymer network crystal made with a mixture of a liquid crystal 45 and polymers 46 sandwiched between the transparent substrates 41 and 42. The transparent-scattering changing element 40 is structured to be able to apply a voltage to the transparent electrodes 43 and 44.

Note here that the refractive index of the polymer 46 of the transparent-scattering changing element 40 is adjusted to be substantially same as the ordinary light refractive index of the liquid crystal 45. Thus, in a state where no voltage is applied to the transparent-scattering changing element 40, molecules of the liquid crystal 45 are randomly aligned. Therefore, the refractive index of the liquid crystal 45 becomes higher than the ordinary light refractive index and becomes unmatched with the refractive index of the polymer 46. As a result, the polymer dispersed liquid crystal and the polymer network liquid crystal come to be in a scattering state. In the meantime, in a case where a voltage is applied to the transparent-scattering changing element 40, the liquid crystal molecules are aligned in a vertical direction of the transparent substrates 41, 42. Thus, the refractive index of the liquid crystal 45 becomes equal to the ordinary light refractive index and becomes the same as the refractive index of the polymer 46, so that the polymer dispersed liquid crystal and the polymer network liquid crystal come to be in a transparent state. When a voltage is applied and the transparent-scattering changing element 40 comes to be in an electrically transparent state, the image display device 1 turns to a narrow vision display. In the meantime, when no voltage is applied and the transparent-scattering changing element 40 comes to be in an electrically scattering state, the image display device 1 turns to a wide vision display.

Between a terminal for supplying a voltage to the transparent-scattering changing element 40 and a power supply, the electric current detection element (operation state detection element) 70A (see FIG. 6) for detecting an electric current flown to the transparent-scattering changing element 40 is inserted and connected. Specifically, a resistor is inserted to the terminal of the transparent-scattering changing element 40, and the electric current detection element 70A measures the electric current flown to the transparent-scattering changing element 40 via the resistor to detect whether or not there is a fault generated in the transparent-scattering changing element 40.

The transparent heater 50 is a heating member for heating the viewing angle changing element 20, which includes a function of changing the refractive index of the liquid crystal 45 that constitutes the transparent-scattering changing element 40 to be in a transparent state so that the image display device 1 comes to be in a viewing angle display through heating the viewing angle changing element 20 by supplying an electric power to the transparent heater 50 from a power supply circuit. The transparent heater 50 is formed by including: a pair of transparent substrates 51 and 52; a transparent electrode 53 formed at least on one of the transparent substrates (the transparent substrate 51 in this embodiment); and an insulating layer 54 provided between the transparent electrode 53 and the transparent substrate 52. The transparent electrode 53 is used as a resistor of the heater, and it is so patterned that a line width is narrow and the distance between the electrode terminals becomes long as much as possible in order to increase the resistance value thereof. The transparent heater 50 generates heat through having an electric current flown to the transparent electrode 53 from a power supply source via a pair of electrode terminals. A forcible heating mechanism (a narrow vision forcible setting module) is formed with the transparent heater 50 and the power supply circuit, however, the transparent heater alone will be referred to as a forcible heating mechanism (the narrow vision forcible setting module) hereinafter. For example, as the transparent electrode 53, indium tin oxide (ITO), tin oxide ($SnO_2$ film), or the like can be used. Further, in order to increase the resistance value of the transparent electrode 53, the transparent electrode 53 may be formed into a thin film or may increase the content oxygen.

Now, the temperature dependency of the transparent-scattering changing element 40 will be described by referring to FIG. 5.

Figure 5:
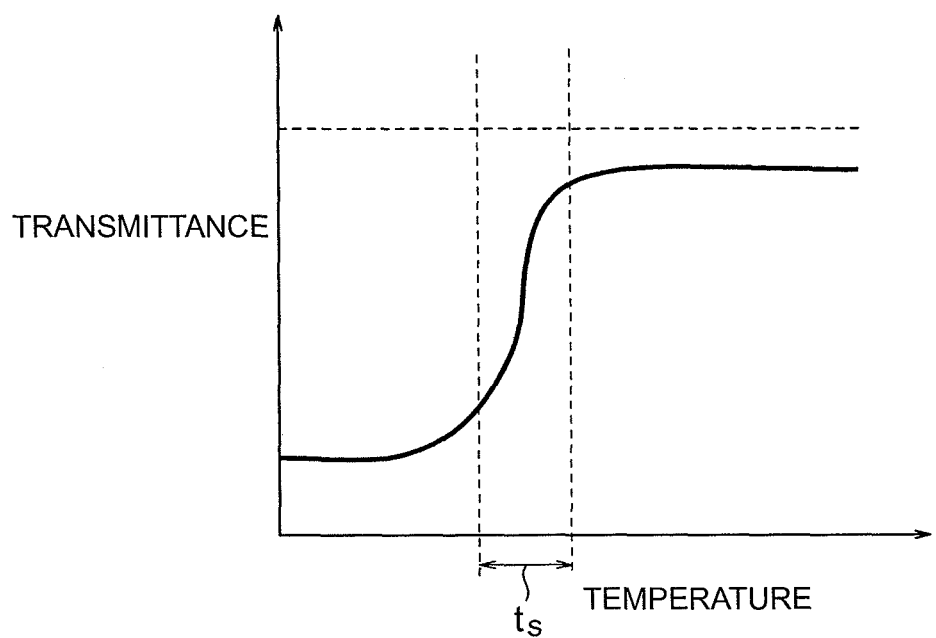
FIG. 5 is a graph showing the temperature dependency of the viewing angle changing element of the image display device shown in FIG. 1.

FIG. 5 shows a graph of measured transmittance in a normal direction of the transparent-scattering changing element 40, when parallel light is radiated to make incident on the transparent-scattering changing element 40. However, no voltage is applied to the transparent-scattering changing element 40 at the time of measurement. Further, dotted lines in the drawing show the transmittance of a case where a voltage is applied to the transparent-scattering changing element 40, which is in a transparent state (transmission state).

In a state where the transparent-scattering changing element 40 is not heated and is in a normal temperature (a state where the temperature on the left side in the drawing is low), the transmittance is low. As described above, no voltage is applied to the transparent-scattering changing element 40, so that there is a difference generated between the refractive index of the liquid crystal 45 and that of the polymers 46 existing in the surroundings of the liquid crystal within the transparent-scattering changing element 40 (the refractive index of the liquid crystal 45 is higher than the ordinary light refractive index). Because of the difference in the diffractive indexes, the transparent-scattering changing element 40 comes to be in a scattering state. Due to the influence thereof, the proportion of light transmitted into the normal direction of the transparent-scattering changing element 40 becomes small.

When the transparent-scattering changing element 40 is heated and the temperature becomes increased, the transmittance of the transparent-scattering changing element 40 is increased drastically in the temperature change of is as shown in FIG. 5. The transmittance approaches to the transmittance (dotted line of the drawing) of a case where the transparent-scattering changing element 40 is in a transparent state. This is because the ordinary light refractive index of the liquid crystal is increased and the extraordinary light refractive index is decreased in accordance with the increase in the temperature of the liquid crystal within the transparent-scattering changing element 40, so that the difference between the refractive index of the liquid crystal layer and the refractive index of the polymers existing in the surroundings of the liquid crystal layer becomes small and the transmittance is increased. As described, the transparent-scattering changing element 40 of the above-described exemplary embodiment is capable of changing to a transparent state without applying a voltage by increasing the temperature from the outside.

While the transparent heater 50 is disposed on the upper side of the transparent-scattering changing element 40 (FIG. 1) in the first exemplary embodiment, it may be disposed under the transparent-scattering changing element 40 as long as it is possible to increase the temperature of the transparent-scattering changing element 40. Further, a transparent electrode heater may be directly formed on the base member of the transparent-scattering changing element 40.

As the above-described non-luminous type display element 60, it is possible to use a liquid crystal panel which employs a driving system of a transverse electric field system, a multi-domain system, a twisted nematic system, and the like. In all of the cases of those liquid crystal display panels, one pixel constituting the display screen is formed by a color filter 65 shown in FIG. 1, a thin film transistor (not shown), a common electrode (not shown), and a pixel electrode (not shown), and a liquid crystal layer 64 shown in FIG. 1 is interposed between the common electrode and the pixel electrode. Further, as shown in FIG. 1, a transparent substrate (TFT substrate) 63 is provided on the outer side (lower side in the drawing) of the liquid crystal layer 64, a retardation plate 62 is provided on the outer side of the transparent substrate 63, and a polarization plate 61 is provided on the outer side of the retardation plate 62, respectively. A transparent substrate (TFT substrate) 66 is provided on the outer side (upper side in the drawing) of the color filter 65, a retardation plate 67 is provided on the outer side of the transparent substrate 66, and a polarization plate 68 is provided on the outer side of the retardation plate 67, respectively.

Figure 6:
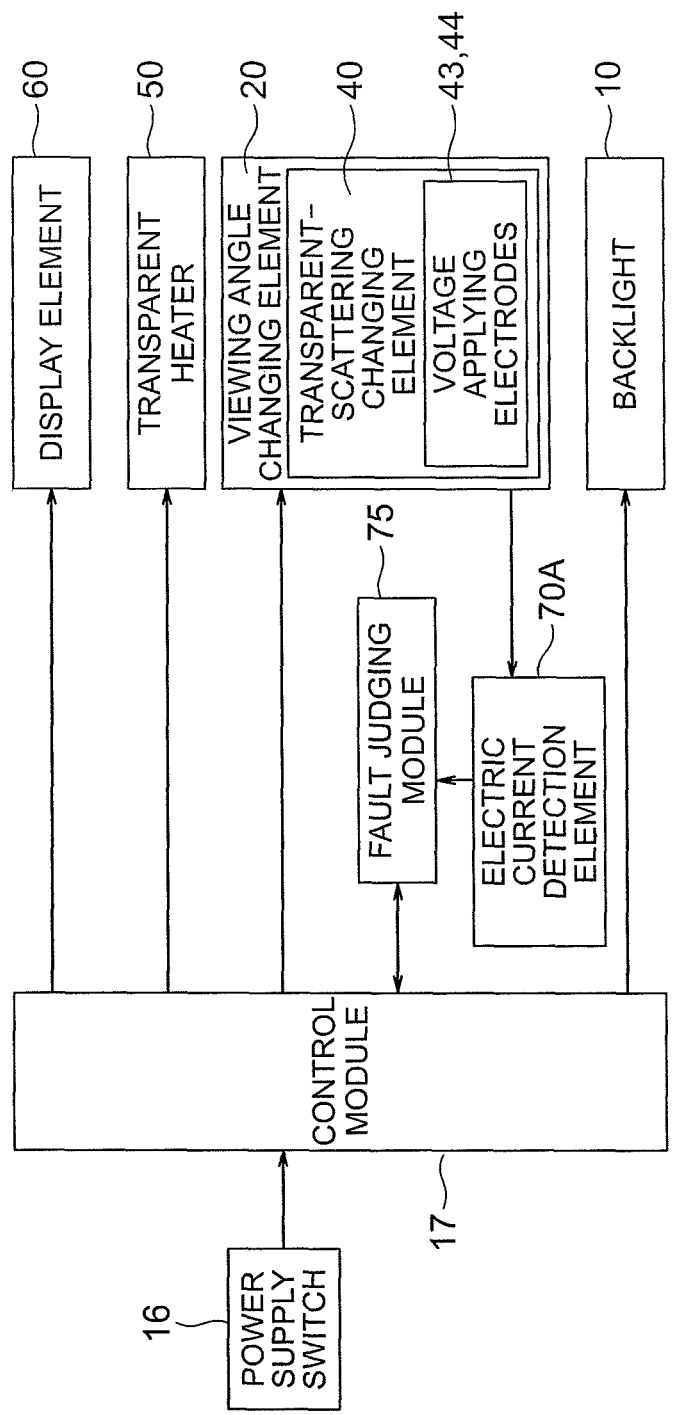
FIG. 6 is a block diagram showing a drive control system of the image display device shown in FIG. 1.

Subsequently, FIG. 6 shows a drive control system of the image display device 1 according to the first exemplary embodiment of the present invention.

Operations of the image display device 1 are controlled by a control module (e.g., CPU) 17. To the control module 17, connected are: a power supply switch 16 for setting on/off the operation of the image display device 1; the backlight 10 which illuminates the display element (liquid crystal panel) 60 according to "on" of the power supply switch 16; a viewing angle changing element 20 which changes the viewing angle display of the display element 60; a forcible heating mechanism (narrow vision forcible setting module) 50 which forcibly changes the display of images outputted from the display element 60 to a narrow vision display by heating the viewing angle changing element 20; and a fault judging module 75 which makes judgments regarding faults in the viewing angle changing element 20 based on the electric current value flown in the transparent-scattering changing element 40 of the viewing angle changing element 20 detected by the electric current detection element 70A.

When the power of the image display device 1 is turned on by an "on"-operation of the power supply switch 16, control of the control module 17 is started and the display element (liquid crystal panel) 60 is illuminated by the backlight 10. For example, in a case of ATM (electronic apparatus) placed at a bank, a convenience store, or the like, the period including the startup of the power where no users is using it is so set that the image outputted from the display element 60 of the image display device 1 is in a wide vision display state by the control of the control module 17 so as to be able to provide information such as advertisements to a great number of customers existing in the surroundings.

At this time, no voltage is applied to the voltage applying electrodes 43, 44 of the viewing angle changing element 20, so that the transparent-scattering changing element 40 is set to be in a scattering state. When the user approaches to an ATM 98, a sensor (not shown) detects the approach. The detection signal thereof is sent to the control module 17, and the image outputted from the display element 60 of the image display device 1 is set to be in a narrow vision display state by the control of the control module 17. At this time, a voltage is applied to the voltage applying electrodes 43, 44 of the viewing angle changing element 20, so that the transparent-scattering changing element 40 is set to be in a transparent state.

The electric current flown to the transparent-scattering changing element 40 of the viewing angle changing element 20 is detected by the electric current detection element 70A, and the detected electric current is sent to the fault judging module 75. The electric current values (electric current values under a normal operation) flown into the transparent-scattering changing element 40 at the time of the wide vision display and the narrow vision display are stored in advance in the fault judging module 75. The fault judging module 75 compares the electric current value detected by the electric current detection element 70A with the stored electric current values to judge an occurrence of a fault in the viewing angle changing element 20. The result of the judgment is transmitted to the control module 17. When the judgment result indicates that there is a fault, the control module 17 starts the operation of the forcible heating module 50 to heat the viewing angle changing element 20 so as to forcibly change the display of the image outputted from the display element 60 to a narrow vision display.

Next, a viewing angle changing processing operation of the image display device 1 will be described.

Figure 7:
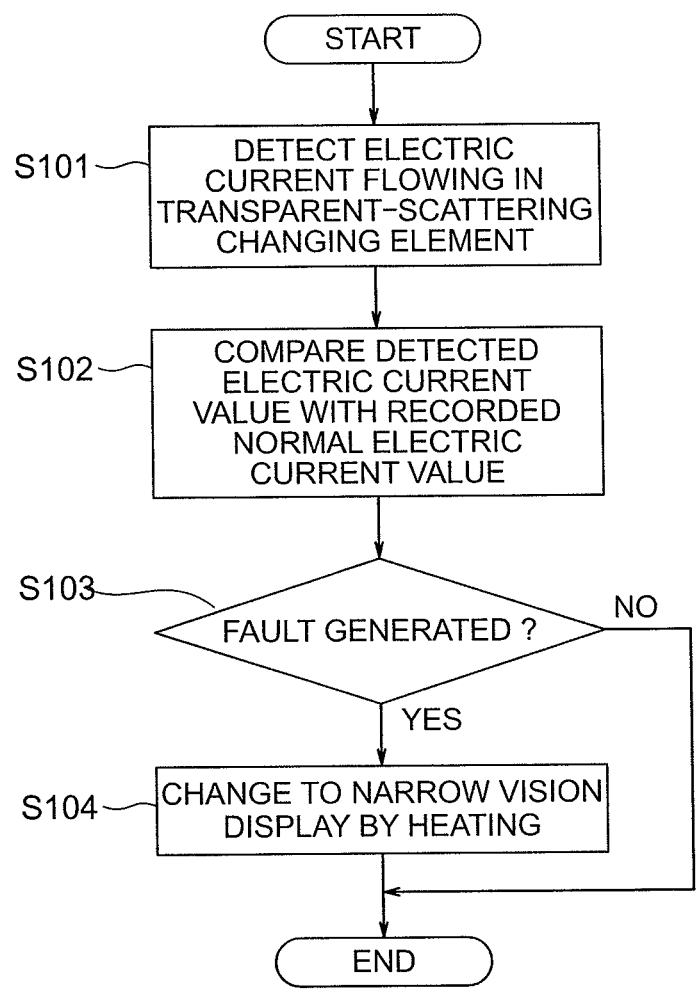
FIG. 7 is a flowchart showing a viewing angle changing processing operation of the image display device shown in FIG. 1.

First, as shown in a flowchart of FIG. 7, the electric current flown to the transparent-scattering changing element 40 provided to the viewing angle changing element 20 is monitored, detected, and measured by the electric current detection element (operation state detection element) 70A (step S101).

The drive current value for the viewing angle changing element 20 detected by the electric current detection element 70A is sent to the fault judging module 75. The fault judging module 75 compares the electric current value detected by the electric current detection element 70A with the premeasured and prestored electric current values that are the values when the transparent-scattering changing element 40 is not having a fault but operating normally (step S102).

Then, the fault judging module 75 judges whether or not there is a fault generated in the viewing angle changing element 20 based on the comparison result (step S103). Specifically, in a case where the difference between the detected electric current value and the prestored electric current values under a normal operation is within a prescribed range specified in advance (e.g., within ±10% of the normal operation electric current value), it is judged that there is no fault being generated in the viewing angle changing element 20. When the difference is out of the prescribed range, it is judged that there is a fault being generated (fault state).

When it is judged as a result that the viewing angle changing element 20 is having no fault, the processing operation is ended. In the meantime, when the viewing angle changing element 20 is having a fault (in a case of a fault state), the display on the display element 60 is forcibly changed to the narrow vision display by the changing module (narrow vision forcible setting module 50 (step S104). In a case where the transparent-scattering changing element 40 is electrically changed to a scattering state and the image display device 1 is set to a state of the wide vision display because of the fault of the viewing angle changing element 20, a risk of having the information (a secret code number of the user) displayed on the screen of the image display device 1 leaked to other users in the surroundings becomes increased. Thus, the display of the image outputted from the display element 60 is forcibly set to the narrow vision display state to prevent the leakage of the information of the user through changing the transparent-scattering changing element 40 to a transparent state by heating the transparent-scattering changing element 40 by the forcible heating mechanism (transparent heater) 50.

Figure 3:
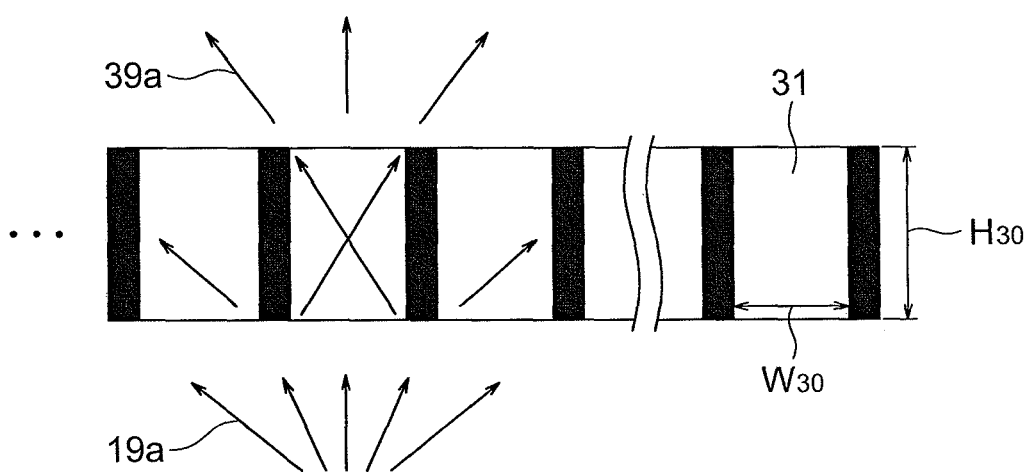
FIG. 3 is an explanatory illustration showing a state of limiting the viewing angles of a micro louver of the image display device shown in FIG. 1.

Further, the above-described viewing angle changing processing operation of the image display device 1 will be described in more details by using FIG. 2-FIG. 4. FIG. 2A shows a narrow vision display operation of the image display device 1. Arrows in the drawing show spread of light emitted from each of the structural members 10, 30, 40, 50, and 60 disclosed in FIG. 1.

First, light 19a emitted from the backlight 10 makes incident on the micro louver 30 of the viewing angle changing element 20. The light made incident within the micro louver 30 cannot pass through except for the light within an angle range of an aspect ratio (a ratio of transparent layer height H30 to transparent layer width W30 (H30/W30)) of the transparent layer 31 as shown in FIG. 3, and the light spread to the out of the angle range is absorbed by the light shielding layer 32 that is adjacent to the transparent layer 31. Thereby, light 39a emitted by transmitting through the micro louver 30 comes to have a higher directivity than the light 19a emitted from the backlight 10. The light 39a emitted from the micro louver 30 makes incident on the transparent-scattering changing element 40.

Note here that when a voltage is applied between the transparent electrodes 43 and 44 of the transparent-scattering changing element 40, the liquid crystal 45 sandwiched between the both transparent electrodes 43 and 44 is aligned to the electric field direction. The refractive index of the liquid crystal 45 becomes matched with the refractive index of the polymers 46 existing in the surroundings thereof due to the change in the alignment, so that the transparent-scattering changing element 40 is turned to a transparent state. The light made incident on the transparent-scattering changing element 40 transmits therethrough while keeping the directivity of the light 39a emitted from the micro louver 30, and makes incident on the transparent heater 50.

The heater 50 does not exhibit the scattering property of such an extent to change the directivity of incident light 49a greatly and transmits the light 49a, so that the light 49a emitted from the viewing angle changing element 20 makes incident on the display element 60 while keeping the directivity. Further, the display element 60 also keeps the directivity as the case of the transparent heater 50, so that light 69a from the display element 60 is emitted by keeping the distribution of the light emitted from the viewing angle changing element 20. Thus, the image display device 1 as a whole is set to a narrow vision display state.

Subsequently, FIG. 2B shows a wide vision display operation of the image display device 1. Arrows in the drawing show spread of light emitted from each of the structural members 10, 30, 40, 50, and 60 as in the case of FIG. 2A described above.

As in FIG. 2A described above, the light 19a emitted from the backlight 10 becomes the light 39a with a wide directivity at a stage where it passes through the micro louver 30 of the viewing angle changing element 20, and makes incident on the transparent-scattering changing element 40.

When no voltage is applied between the transparent electrodes 43 and 44 of the transparent-scattering changing element 40, the liquid crystal molecules sandwiched between the both transparent electrodes 43 and 44 stay in a random alignment. Thereby, there is a difference generated between the refractive index of the liquid crystal 45 and that of the polymers 46, so that the transparent-scattering changing element 40 turns to a scattering state. Thus, the light 39*a* making incident on the transparent-scattering changing element 40 is scattered when passing through the transparent-scattering changing element 40. Therefore, the directivity of light 49*b* emitted from the transparent-scattering changing element 40 becomes narrower than that of the incident light 39*a*.

The light 49*b* emitted from the transparent-scattering changing element 40 makes incident on the transparent heater 50. The transparent heater 50 does not exhibit the scattering property of such an extent to change the directivity of incident light 49*b* greatly and transmits the light 49*b*.

Thus, light 59*a* emitted from the transparent heater 50 makes incident on the display element 60 while keeping the directivity of the light 49*b* emitted from the transparent-scattering changing element 40 of the viewing angle changing element 20. Further, the display element 60 also keeps the directivity as in the case of the transparent heater 50, so that light 69*a* from the display element 60 is emitted by keeping the distribution of the light emitted from the transparent-scattering changing element 40. Thus, the image display device 1 as a whole is set to a wide vision display state.

As described, the viewing angle changing operation of the image display device 1 can be achieved by electrically changing the transparent-scattering changing element 40 to a transparent state and a scattering state. Thus, a fault in changing the viewing angle of the image display device 1 means a fault generated in the transparent-scattering changing element 40. A specific problem in the fault in changing the viewing angle is a case where the image display device 1 accidentally turns to the wide vision display when it is desired to be used as the narrow vision display.

The fault in the viewing angle changing operation of the image display device 1, i.e., the fault in the transparent-scattering changing element 40, is specifically classified into four fault modes as shown in a table of FIG. 4.

Fault mode 1 is an abnormal voltage fault mode of a case where a voltage of equal to or less than a threshold voltage of the transparent-scattering changing element 40 is applied between the transparent electrodes 43 and 44.

Fault mode 2 is an open fault mode of a case where the electrode terminal connected to the transparent-scattering changing element 40 is in a state (open state) of being incapable of electrically connected to the transparent electrodes 43, 44 of the transparent-scattering changing element 40, so that the voltage cannot be supplied to the transparent-scattering changing element 40.

Fault mode 3 is a short-circuit fault mode of a case where the transparent-scattering changing element 40 short-circuits, so that the voltage cannot be applied between the elements.

Fault mode 4 is an overvoltage fault mode of a case where an excessive voltage is applied to the transparent-scattering changing element 40 because of some reasons.

In the fault modes 1 to 3 out of the fault modes described above, a sufficient voltage cannot be applied to the transparent-scattering changing element 40, so that the element comes to be in a scattering state. Thus, the image display device 1 is set to a wide vision display state. In the meantime, in the fault mode 4, the transparent-scattering changing element 40 comes to be in a transparent state. Thus, the image display device 1 is set to be in a narrow vision display state.

Whether or not there is an occurrence of those fault modes 1 to 4 can be judged by detecting the electric current value flown in the transparent-scattering changing element 40 by the electric current detection element 70A. In a case of the fault modes 1 and 2, the electric current flown in the transparent-scattering changing element 40 becomes smaller than the electric current value required for the narrow vision display, i.e., for setting the image display device 1 to a transparent state. Particularly, in the fault mode 2, a voltage cannot be applied to the transparent-scattering changing element 40, so that the electric current is not flown into the transparent-scattering changing element 40. Thus, the electric current value of the fault mode 2 is smaller than that of the fault mode 1.

In the case of the fault modes 3 and 4, the electric current flown in the transparent-scattering changing element 40 becomes greater than the electric current value required for the wide vision display, i.e., for setting the image display device 1 to a transparent state (narrow vision display). Particularly, in the fault mode 3, an excessive electric current is flown in the transparent-scattering changing element 40 because of short-circuit generated in the transparent scattering changing element 40.

That is, as is clear in the above-described related techniques, no measure is taken for the fault generated in the viewing angle changing element 20 of the conventionally known related techniques. Thus, it is only a way to actually check the display screen for detecting whether or not there is a fault. Therefore, displayed information may become leaked until checking of the screen can be done. However, through monitoring the electric current value flown in the transparent-scattering changing element 40 by using the detection element as in the first exemplary embodiment described above, it is possible to detect a fault generated in the viewing angle changing element 20 without checking the display screen.

(Entire Operation)

Next, the entire operation of the image display device 1 at the time of having a fault will be described.

The image display device 1 detects the electric current value flown in the viewing angle changing element 20, i.e., the electric current value flown in the transparent-scattering changing element 40, by using the electric current detection element 70A (see FIG. 6). It is sufficient to execute the detection processing only when a user is using the device 1, if it is only for the purpose of preventing leakage of secret information (e.g., secret code numbers) of the user. However, it is desirable to execute the detection processing periodically at every prescribed time interval set in advance, considering the cases of abnormal state where the overvoltage is applied between the elements, for example. The image display device 1 in that case stores desired electric current values flown to the transparent-scattering changing element 40 in the wide vision display and the narrow vision display under a normal operation in the storage section of the fault judging module 75 provided within the image display device 1 in advance as the reference electric current values.

The fault judging module 75 of the image display device 1 compares the stored reference electric current values of each display state with the detected (actually measured) electric current value to judge whether or not there is a fault generated in the transparent-scattering changing element 40, i.e., the viewing angle changing element 20. Specifically, first, judged is whether or not it is in a state used by the user. Then, when judged that is a state being used by the user, the fault judging module 75 reads out the stored reference electric current value of the narrow vision display, and compares the reference electric current value with the detected electric current value.

When the difference between the detected electric current value and the reference electric current value is judged as being within a prescribed range (e.g., ±10% of the reference electric current values) as a result of the comparison, it is judged that there is no fault generated in the viewing angles changing element 20. When the difference is out of the prescribed range, it is judged that there is a fault. The above-described modes 1 and 2 correspond to a case where the detected electric current value is small and out of the prescribed range. In the meantime, the above-described fault modes 3 and 4 correspond to a case where the detected electric current value is large and out of the prescribed range.

Further, when it is found in the judgment that the device is not being used, the fault judging module 75 reads out the stored reference electric current value of the wide vision display and compares the reference electric current value with the detected electric current value. When the difference between the detected electric current value and the reference electric current value is found to be within the prescribed range as a result of the comparison, it is judged that there is no fault generated in the viewing angle changing element 20. When the difference is out of the prescribed range, it is judged that there is a fault.

In a case of the wide vision display under a normal operation, no voltage is applied between the transparent electrodes 43 and 44 of the transparent-scattering changing element 40. Thus, no electric current flows in the transparent scattering changing element 40. Therefore, the fault mode 1, 3, or 4 corresponds to a case where the detected electric current value is out of the prescribed range, i.e., a case where the detected electric current value is large and out of the prescribed range. Further, in the case of the fault mode 3 or 4, the detected electric current value becomes larger than the stored reference electric current value of the narrow vision display. Thus, it is possible to discriminate whether it is an occurrence of the fault mode 3 or an occurrence of the fault mode 4 through comparing the detected electric current value with the reference electric current value.

In a case where it is judged as a result of the comparison and judgment that the transparent-scattering changing element 40 is having a fault, the image display device 1 first stops the supply of the voltage to the transparent-scattering changing element 40. Then, the transparent heater (the forcible heating mechanism) 50 as a changing module is operated to heat the transparent-scattering changing element 40. This makes it possible to detect an occurrence of a fault instantly even when there is a fault generated in the transparent-scattering changing element 40. Thus, the transparent-scattering changing element 40 is heated and turned into a transparent state, so that the image display device 1 is forcibly set to a narrow vision display. Thereby, leakage of the information on the display can be prevented.

In the fault mode 4, it is unnecessary to heat the transparent-scattering changing element 40 by the transparent heater if it is solely for preventing leakage of the information of the user since the transparent-scattering changing element 40 is being turned into the transparent state. However, it is in an abnormal state where the overvoltage is applied between the elements, so that the supply of the voltage to the transparent-scattering changing element 40 may be stopped and the transparent-scattering changing element 450 may be heated as in the case of the other fault modes 1 to 3 for the security. It is possible to keep the security by avoiding the overvoltage through stopping supply of the voltage and to set the image display device to a narrow vision display by heating.

While a PLNC (Polymer Network Liquid Crystal) element that comes into a scattering state when no voltage is applied between the transparent electrodes 43, 44 is used as the transparent-scattering changing element 40 of the image display device 1, the transparent-scattering changing element 40 is not limited only to that. For example, a reverse PNLC element which comes to be in a transparent state under a voltage-unapplied state may be used. In that case, the transparent state and the scattering state in the voltage applied state and the unapplied state of the transparent-scattering changing element 40 are reversed. Therefore, the relation between the fault state of the transparent-scattering changing element 40 and the operation of the transparent heater (forcible heating mechanism) 50 is inverted.

That is, in a case where the reverse PNLC element is used, the transparent-scattering changing element 40 comes to be in a scattering state only in the fault mode 4 where the overvoltage is applied out of the above-described fault modes. Thus, it is necessary to change the transparent-scattering changing element 40 to a transparent state by forcibly operating the transparent heater (forcible heating mechanism) 50 as the changing module.

In the meantime, in the cases of the other fault modes 1 to 3, the transparent-scattering changing element 40 is in a transparent state. Thus, it is unnecessary to forcibly heat the element 40 by operating the transparent heater 50. However, the voltage supply to the transparent-scattering changing element 40 cannot be done because of the fault in all of the cases of the fault modes 1 to 3, so that it is also possible to forcibly change to the narrow vision display through heating the element 40 by the transparent heater 50.

As an exemplary advantage according to the invention, the invention makes it possible to detect a fault instantly, even when the fault in changing the viewing angles occur in the image display device capable of changing the viewing angle and in the electronic apparatus using the same. Further, the image display device can be forcibly changed into the narrow vision display based on the detection, so that it is possible to prevent leakage of information displayed on the display screen.

Second Exemplary Embodiment

Next, a second exemplary embodiment of the image display device according to the present invention will be described by referring to FIG. 8-FIG. 11. Note here that same reference numerals are applied to the same structural members as those of the first exemplary embodiment described above.

Figure 8:
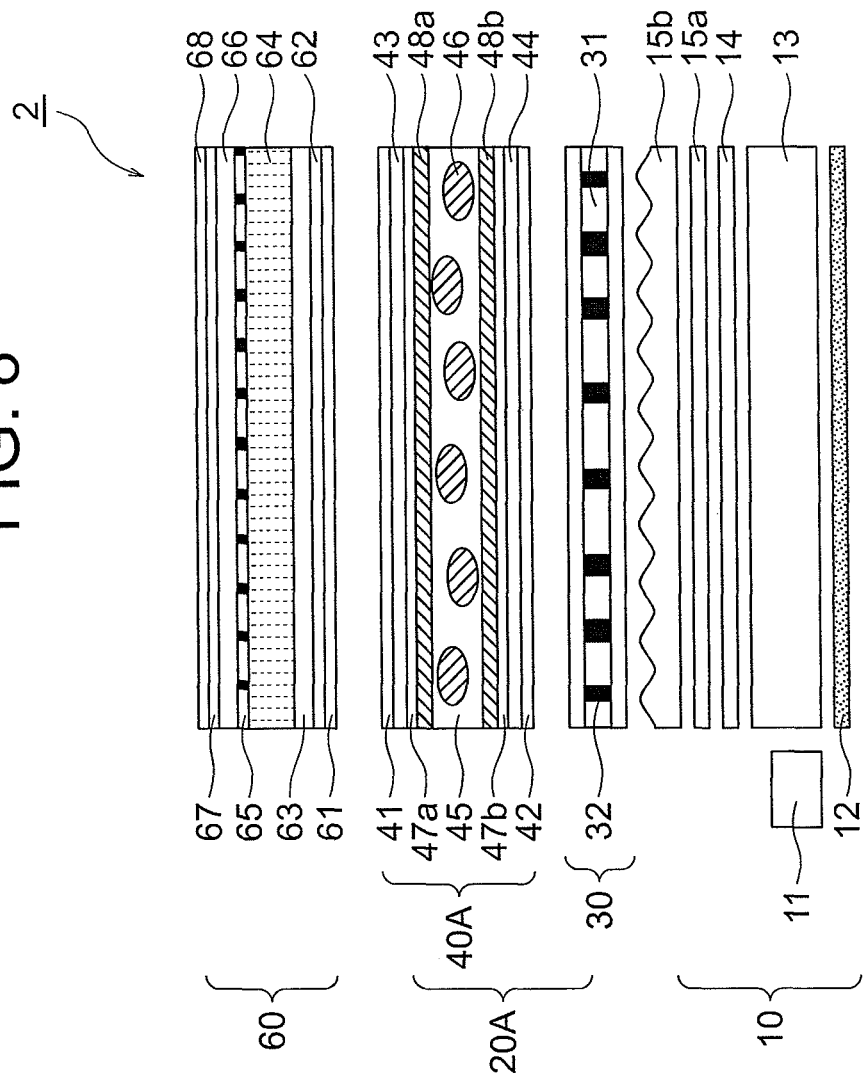
FIG. 8 is a sectional view showing a second exemplary embodiment of the image display device according to the present invention.

As shown in FIG. 8, an image display device 2 is formed by including: a backlight 10; a viewing angle changing element 20A provided on the upper side of the backlight 10 for electrically changing the viewing angle range; and a non-luminance type display element 60 provided on the upper side of the viewing angle changing element 20A. Note that the members under the same reference numerals as those of the image display device 1 of the first exemplary embodiment shown in FIG. 1 have the same functions. Further, while not shown in FIG. 8, the image display device 2 is also provided with an electric current detection element (operation state detection element) 70A (see FIG. 9 and FIG. 10) which monitors the state of the viewing angle changing element 20A and a fault judging module 75 (see FIG. 10) which judges whether or not the viewing angle changing element 20A is having a fault based on the measurement value detected by the electric current detection element 70A.

The difference between the second exemplary embodiment and the first exemplary embodiment is that a transparent-scattering changing element 40A of the viewing angle changing element 20A is provided with transparent electrodes 48a and 48b used at the time of having a fault (voltage applying electrodes used exclusively when there is a fault) as a narrow vision forcible setting module (changing module 50) for forcibly changing the viewing angle range to the narrow vision display at the time of having a fault. In the second exemplary embodiment, the transparent heater 50 (the changing module of the first exemplary embodiment) for heating the viewing angle changing element 20A is not provided.

Figure 9:
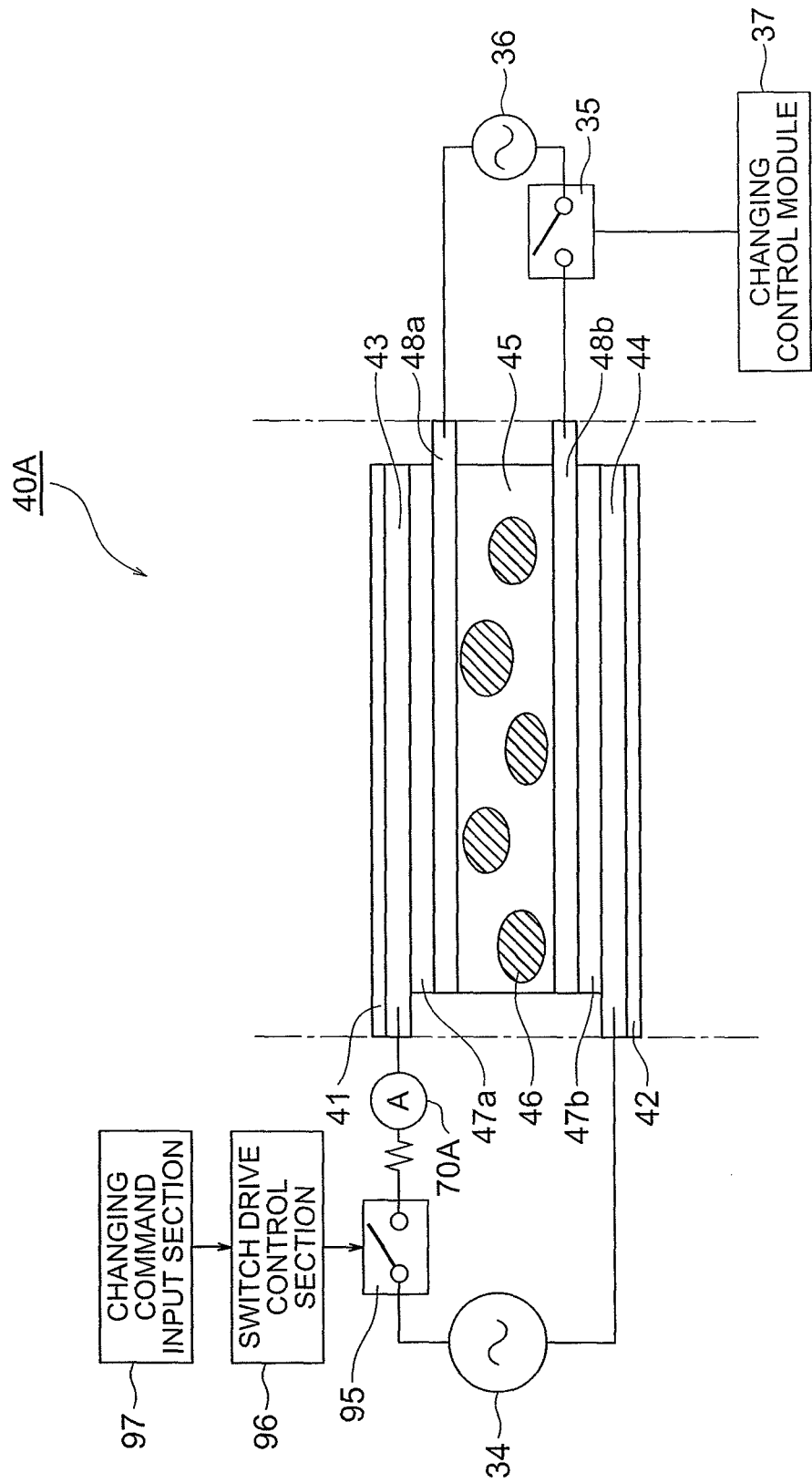
FIG. 9 is a sectional view of a transmission-scattering changing element of the image display device shown in FIG. 8.

FIG. 9 shows an example of the transparent-scattering changing element 40A of the second exemplary embodiment. The transparent electrodes 48a, 48b are electrodes loaded in addition to the transparent electrodes 43, 44 that are used under a normal operation. The transparent electrodes 48a, 48b are covered by insulating layers 47a, 47b, and insulated from the transparent electrodes 43, 44. Further, while a power supply source 36 is connected to the transparent electrodes 48a, 48b used at the time of having a fault, the connection between both transparent electrodes are electrically opened by a switch 35 or the like except for the time of having a fault generated in the viewing angle changing element 20A. A changing control module 37 for changing on/off of the switch is connected to the switch 35. The changing control module 37 operates based on changing control signals from the control module 17 (see FIG. 10).

The electric current detection element 70A which monitors the state of the viewing angle changing element 20A is interposed between the terminal connected to the transparent electrodes 43, 44 used under a normal operation and the power supply source 34. Further, a voltage-application changing switch 95 for changing whether or not to apply a voltage between the transparent electrodes 43, 44 is connected between the electric current detection element 70A and the power supply source 34. The voltage-application changing switch 95 operates based on drive control signals from a switch drive control section 96, and the switch drive control section 96 operates based on changing command signals from a changing command input section 97.

For example, in FIG. 9, when a user approaches to an ATM (electronic apparatus) in a bank or a convenience store, a sensor as the changing command input section 97 detects the approach of the user, and a changing command signal based on the detection is sent to the switch drive control section 96 from the changing command input section 97. The switch drive control section 96 transmits a drive control signal for changing the voltage-application changing switch 95 to the voltage-application changing switch 95 based on the received changing command signal. Upon receiving this signal, the voltage-application changing switch 95 is turned on, and a voltage is applied between the transparent electrodes 43, 44. Thereby, the transparent-scattering changing element 40A comes to be in a transparent state electrically, and the image display device 2 is changed to a narrow vision display state so that the personal information of the user displayed on the display screen is not leaked to those in the surroundings. However, the changing operation of the voltage-application changing switch 95 may be done manually without providing the switch drive control section 96 and the changing command input section 97.

Figure 10:
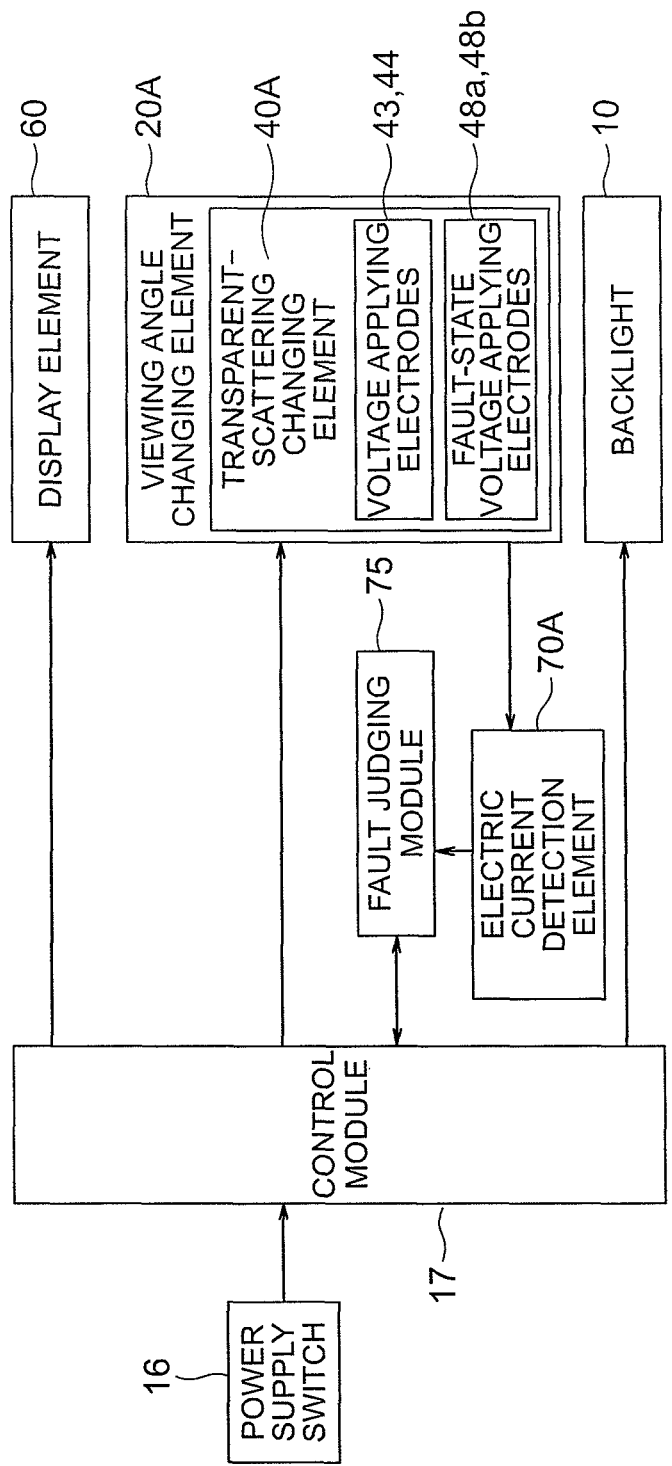
FIG. 10 is a block diagram showing a drive control system of the image display device shown in FIG. 8.

FIG. 10 shows a drive control system of the image display device 2 according to the second exemplary embodiment.

The operation of the image display device 2 is controlled by the control module (e.g., CPU) 17, for example. Note here that the power supply switch 16, the backlight 10, the display element 60, the viewing angle changing element 20A, the transparent-scattering changing element 40A, the electric current detection element 70A, and the fault judging module 75 have the same functions as the respective members under the same reference numerals of the image display device 1 described in the first exemplary embodiment.

The difference with respect to the drive control system of the first exemplary embodiment is that the viewing angle changing element 20A of the drive control system according to the second exemplary embodiment is provided with the fault-state voltage applying electrodes 48a and 48b which are used when there is a fault generated in the transparent-scattering changing element 40A.

Illuminating the display element 60 under controls of the control module 17 at the rise of the power upon an on-operation of the power supply switch 16, setting of the wide vision display state when the device is not being used, setting of the narrow vision display when the device is being used, etc., are same as the control processing contents described in the first exemplary embodiment. Further, detection of the electric current executed by the electric current detection element 70A, judgment of a fault executed by the fault judging module 75, etc., are also same as the processing contents described in the first exemplary embodiment. Unlike the controls of the first exemplary embodiment, when it is judged as a result of the fault judgment executed in the second exemplary embodiment that there is a fault being generated, the control module 17 is designed to execute a control to forcibly change the display of the image outputted from the display element 60 of the image display device 2 to a narrow vision display state by stopping supply of the voltage to the transparent electrodes 43, 44 used under a normal operation and by applying a voltage to the transparent electrodes 48a, 48b (voltage applying electrodes used exclusively when there is a fault) used at the time of having a fault. Through applying a voltage to the voltage applying electrodes 48a, 48b used exclusively for the time of having a fault, the transparent-scattering changing element 40A is turned to a transparent state electrically. Thereby, the image display device 2 is set to a narrow view field display.

Figure 11:
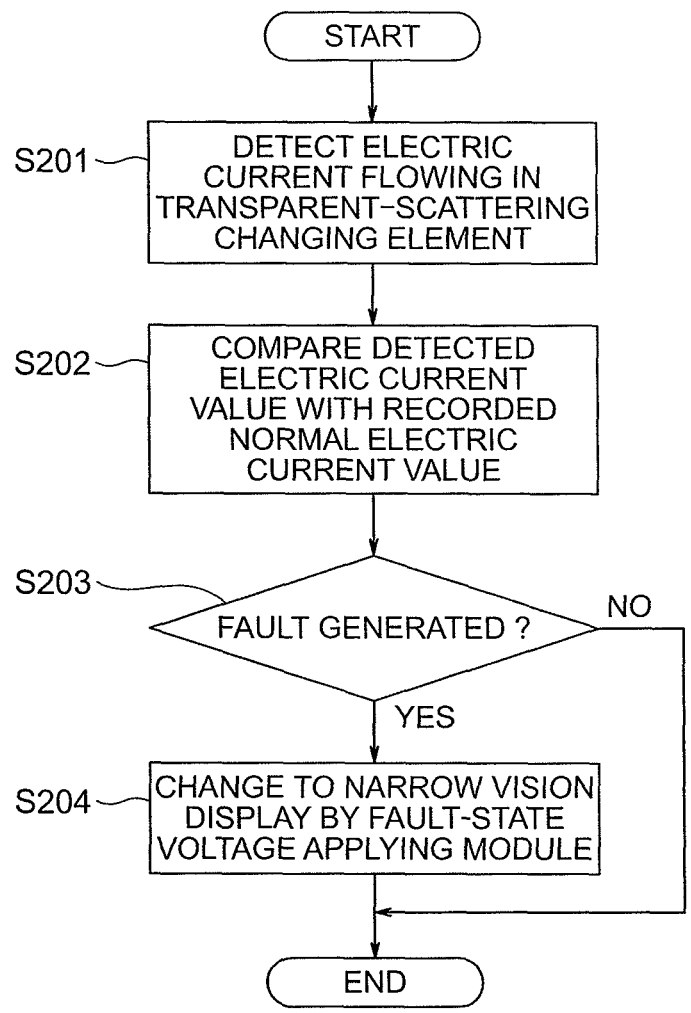
FIG. 11 is a flowchart showing a viewing angle changing processing operation of the image display device shown in FIG. 8.

Next, the viewing angle changing processing operation of the image display device 2 will be described. The flowchart of FIG. 11 shows the viewing angle changing processing operation of the image display device 2. Contents of each of the processing operations of steps S201 to S203 are the same as the contents of each of the processing operations of steps S101 to S103 of the viewing angle changing processing operation (the flowchart shown in FIG. 7) of the image display device 1 according to the first exemplary embodiment described above. Further, an operation executed in step S204 for forcibly changing the display of the display element 60 to a narrow vision display when the viewing angle changing element 20A is having a fault is the same as that of the first exemplary embodiment (the operation of step S104 of the flowchart shown in FIG. 7).

However, the viewing angle changing processing of the image display device 2 is different from that of the first exemplary embodiment (forcible heating mechanism (transparent heater)) in respect that a voltage forcible applying mechanism is provided as a narrow vision forcible setting module 50 for forcibly changing the narrow vision display in step S204. For example, as the voltage forcible applying mechanism, the image display device 2 is further provided with the voltage applying electrodes 48a, 48b used exclusively when there is a fault, in addition to the voltage applying electrodes 43, 44 used under a normal state where no fault is generated. The voltage applying electrodes 48a and 48b are provided by sandwiching the liquid crystal layer 45, and a voltage is applied thereto when there is a fault. Thereby, the voltage applying electrodes 48a and 48b give a voltage difference to the transparent-scattering changing element 40A to turn the transparent-scattering changing element 40A to a transparent state, and to forcibly set the display of the image outputted from the display element 60 to a narrow vision display so as to prevent leakage of the information of the user.

Further, the operation of the image display device 2 at the time of having a fault will be described in more details.

A fault generated in the viewing angle changing function is based on a fault generated in the transparent-scattering changing element 40A as in the case of the image display device 1 according to the first exemplary embodiment described above. Further, the fault modes 1-4 are the same as the case of the first exemplary embodiment.

The image display device 2 detects the electric current value flowing in the viewing angle changing element 20A, i.e., the electric current value flowing in the transparent-scattering changing element 40A, by using the electric current detection element (operation state detection element) 70A which is connected to the transparent electrodes 43, 44 used for a normal operation. At this time, the image display device 2 stores in advance desired electric current values of a wide vision display and a narrow vision display flowing in the transparent-scattering changing element 40A in the storage section of the fault judging module 75 provided within the image display device 2.

The image display device 2 compares the stored electric current values of each display state with the detected electric current value, and judges whether or not the transparent-scattering changing element 40A, i.e., the viewing angle changing element 20A, is having a fault. The detailed contents of comparison/judgment are the same as those of the first exemplary embodiment. In a case where it is judged as a result of the comparison and judgment that the transparent-scattering changing element 40A is having a fault, the image display device 2 first stops the supply of the voltage to the transparent-scattering changing element 40A, i.e., stops the supply of the voltage to the transparent electrodes 43, 44 used for a normal operation. Then, the transparent electrodes 48a, 48b provided for the case of having a fault (voltage forcible applying mechanism used exclusively when there is a fault) are operated to be used as a drive source of the transparent-scattering changing element 40A.

This makes it possible to drive the transparent-scattering changing element 40A by adding a potential difference to the liquid crystal layer 45 through applying a voltage between the transparent electrodes 48a and 48b, even when there is a fault generated in the viewing angle changing element 20A. Thus, the transparent-scattering changing element 40 to which the voltage is applied turns into a transparent state electrically, so that the image display device 2 is forcibly set to a narrow vision display state. Thereby, leakage of the information on the display screen can be prevented, even when there is a fault generated in the viewing angle changing element 20A.

In this exemplary embodiment, insulating layers 47a, 47b and the transparent electrodes 48a, 48b are interposed between the transparent electrodes 43 and 44 used for a normal drive, in addition to the transparent-scattering changing layer. Thus, the potential difference applied to the transparent-scattering changing layer becomes smaller than the case where there is only the transparent-scattering changing layer provided between the transparent electrodes 43 and 44. Therefore, in order to compensate for the drop in the voltage difference, a voltage that is a sum voltage of the potential difference required for the transparent-scattering changing layer and the potential drop generated because the insulating layers 47a, 47b and the transparent electrodes 48a, 48b are interposed is applied between the transparent electrodes 43 and 44 for driving. Further, the voltage drop is added to the stored electric current values that are compared and referred with respect to the electric current values detected by the electric current detection element 70A.

Other structures and operation effects thereof are the same as those of the case of the first exemplary embodiment described above.

Third Exemplary Embodiment

Next, a third exemplary embodiment of the image display device according to the present invention will be described by referring to FIG. 12.

The image display device according to the third exemplary embodiment is formed by including a backlight 10 and a display element 60 as in the case of the image display device 2 according to the second exemplary embodiment shown in FIG. 8. However, in a transparent-scattering changing element 40B constituting a viewing angle changing element 20B of the image display device according to the third exemplary embodiment, only a pair of transparent electrodes 43 and 44 are provided by sandwiching a liquid crystal layer 45 as shown in FIG. 12. Further, on the same side of the transparent electrodes 43 and 44, not only electrode terminals 21A, 21B used under a normal operation but also electrode terminals 22A, 22B used at the time of having a fault are provided on the same side of the transparent-scattering changing element 40B where the electrode terminals 21A, 21B are provided. In this respect, the transparent-scattering changing element 40B is greatly different from the transparent-scattering changing element 40A of the second exemplary embodiment which does not have such structure.

The backlight 10, a micro louver 30, and the display element 60 have the same functions and exhibit same operational effects as those of the second exemplary embodiment. Further, as in the case of the second exemplary embodiment, the image display device according to the third exemplary embodiment includes: an electric current detection element 70A which monitors the state of the viewing angle changing element 20B; and a fault judging module 75 which judges an occurrence of a fault generated in the viewing angle changing element 20B (the transparent-scattering changing element 40B) based on the measurement value from the detection element.

FIG. 12A is a fragmentary plan view showing the transparent-scattering changing element 40B of the image display device according to the third exemplary embodiment. FIG. 12B is a perspective view of the transparent-scattering changing element 40B of the image display device according to the third exemplary embodiment. Note, however, that transparent substrates 41, 42 provided on the outside of the transparent electrodes 43, 44 are not illustrated in FIG. 12A and FIG. 12B.

The image display device according to the third exemplary embodiment includes the electrode terminals (voltage forcibly applying mechanism) 22A and 22B used at the time of having a fault as a means for forcibly changing the viewing angle range to a narrow vision display when there is a fault generated in the transparent-scattering changing element 40B. The electrode terminals 22A, 22B are provided to the transparent electrodes 43, 44 used under a normal operation, and are provided separately from the electrode terminals 21A, 21B which are provided for applying a voltage to the transparent electrodes 43, 44 at the time of a normal operation. Further, the electrode terminals 22A, 22B are provided on the same side of the transparent electrodes 43, 44 where the electrode terminals 21A, 21B used under a normal operation are provided. That is, the electrode terminals 22A, 22B are provided on the same side of the transparent-scattering changing element 40B along with the electrode terminals 21A, 21B.

The electrode terminals 22A, 22B used at the time of having a fault are connected to a power supply source 36. However, those are in an electrically open state by a switch 35 or the like according to a changing control signal from a changing control module 37 except for a case where there is a fault being generated. When it is judged by the fault judging module 75 that there is a fault generated in the transparent-scattering changing element 40B, the changing control module 37 turns on the switch 35 according to the judgment signal so that a voltage is applied to the electrode terminals 22A, 22B used at the time of having a fault. Further, the electric current detection element (operation state detection element) 70A which monitors the state of the viewing angle changing element 20B is inserted between the power supply source 34 and the electrode terminals 21A and 21B used under a normal operation.

Through having such structure, the image display device according to the third exemplary embodiment is capable of securely detecting that there is a fault generated in the transparent-scattering changing element 40B, and capable of operating the transparent-scattering changing element 40B when there is a fault by applying a voltage via the electrode terminals 22A, 22B used at the time of having a fault. Therefore, the transparent-scattering changing element 40B is electrically turned to a transparent state when there is a fault, and the image display device is forcibly set to a narrow vision display state. This makes it possible to prevent leakage of the information displayed on the display screen, even when there is a fault. Further, the third exemplary embodiment does not have a layer for decreasing the potential difference applied to the transparent-scattering changing element 40B, such as the insulating layers 47a, 47b and the transparent electrodes 48a, 48b of the second exemplary embodiment shown in FIG. 9, between the transparent electrodes 48a and 48b used for a normal drive. Therefore, it is unnecessary to increase the potential difference applied between the transparent electrodes 43 and 44 by taking the voltage drop into consideration. In addition, it is possible to compactify the size of the transparent-scattering changing element 40B.

Other structures and operation effects thereof are the same as those of the case of the second exemplary embodiment described above.

Fourth Exemplary Embodiment

Next, a fourth exemplary embodiment of the image display device according to the present invention will be described by referring to FIG. 13.

The image display device according to the fourth exemplary embodiment is a device in which a part of the structure of the transparent-scattering changing element 40A is changed among the image display device 2 (see FIG. 8) according to the second exemplary embodiment described above. The other members such as a backlight 10, a micro louver 30, and a display element 60 have the same functions as those of the second exemplary embodiment. Further, as in the case of the second embodiment, an electric current detection element (operation state detection element) 70A for monitoring the state of a viewing angle changing element 20C and a fault judging module 75 for judging an occurrence of a fault generated in the viewing angle changing element 20C based on the measured value from the detection element are also provided.

Figure 13A:
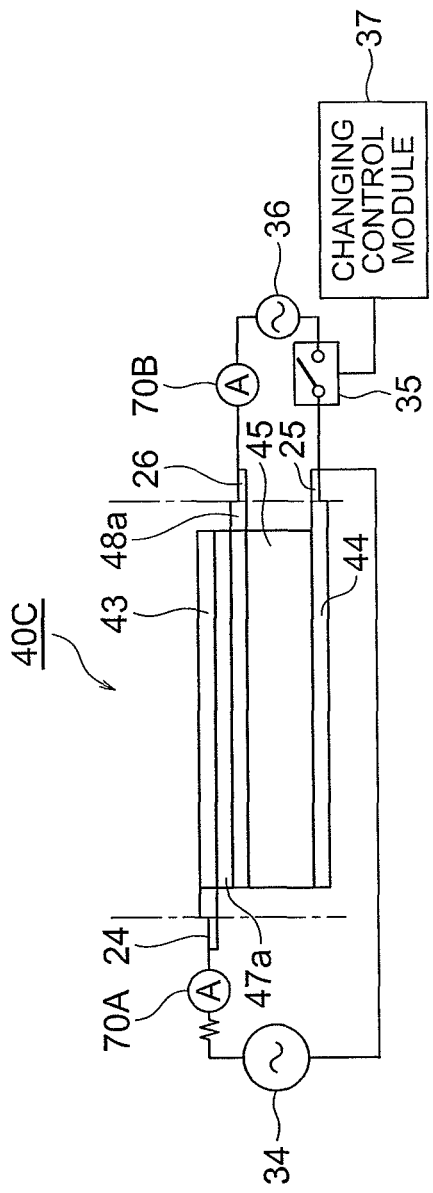
FIG. 13A is a plan view of a transmission-scattering changing element of an image display device according to a fourth exemplary embodiment of the present invention.
Figure 13B:
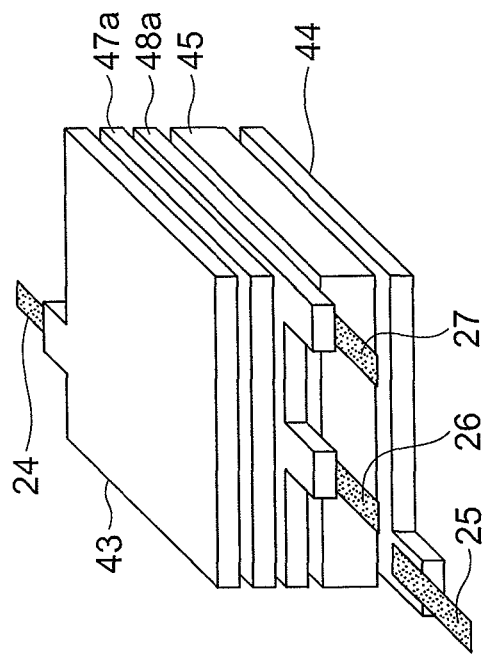
FIG. 13B is a perspective view thereof.

FIG. 13A is a sectional view of a transparent-scattering changing element 40C which constitutes the image display device of the fourth exemplary embodiment. Further, FIG. 13B is a perspective view of the transparent-scattering changing element 40C. Note, however, that transparent substrates 41, 42 provided on the outside of transparent electrodes 43, 44 are not illustrated in FIG. 13B.

In the fourth exemplary embodiment, as shown in FIG. 13, the transparent electrode 44 is stacked on the lower side of a liquid crystal layer 45. Further, a transparent electrode 48a is staked on the upper side of the liquid crystal layer 45, an insulating layer 47a is provided on the upper side thereof, and the transparent electrode 43 is stacked on the upper side thereof. Therefore, the transparent-scattering changing element 40C of the fourth exemplary embodiment is different from the structure of the transparent-scattering changing element 40A according to the second exemplary embodiment in respect that the transparent electrode 48b and the insulating layer 47b are not stacked between the transparent electrode 44 and the liquid crystal layer 45. A transparent substrate is stacked on the outer side (on the upper side and lower side of the drawing) of the transparent electrodes 43 and 44, respectively, although not shown in FIG. 13.

Further, as shown in FIG. 13B, electrode terminals 24, 25, and 26 for applying a voltage from a power supply source are provided to the respective transparent electrodes 43, 44, and 48a. Furthermore, an electrode terminal 27 for applying a voltage to operate the transparent electrode 48a as a heater at the time of having a fault is provided to the transparent electrode 48a on the same side as the side where the electrode terminal 26 is provided.

Further, as shown in FIG. 13A, electric current detection elements (operation state detection elements) 70A and 70B for monitoring the operation state of the viewing angle changing element 20C are provided in the fourth exemplary embodiment. The electric current detection element 70A is provided between the electrode terminal 24 of the transparent electrode 43 used under a normal operation and a power supply source 34, and the electric current detection element 70B is provided between the electrode terminal 26 and a power supply source 36. Application of the voltage between the electrode terminals 25 and 26 is changed by the switch 35 connected between the power supply source 36 and the electrode terminal 25, and on/off of the switch is controlled by a changing control module 37 connected to the switch 35.

Among the electrode terminals provided to each of the transparent electrodes 43, 44, and 48a, the electrode terminals 24 and 25 are used as electrode terminals for monitoring the viewing angle changing element 20C under a normal operation, while the electrode terminal 26 is used as an electrode terminal for judging which one of the electrode terminals 24 and 25 has a fault when a fault is generated. Further, the electric current detection element 70A is used as a detection element for detecting that there is a fault generated in the electrode terminal 24 or the electrode terminal 25, while the electric current detection element 70B is used as a detection element for detecting which one of the electrode terminals 24 and 25 a fault is generated.

Next, the operation of the image display device ah the time of having a fault will be described. Under a normal operation of the transparent-scattering changing element 40C, a voltage is applied between the electrode terminal 24 and the electrode terminal 25, i.e., between the transparent electrode 43 and the transparent electrode 44, to give a potential difference to the transparent-scattering changing element 40C for driving it. At that time, the potential difference to be applied between the transparent electrode 43 and the transparent electrode 44 is determined by adding a voltage drop generated because of the insulating layer 47a and the transparent electrode 48a interposed between the transparent electrodes 43 and 44, as in the case of the second exemplary embodiment described above.

Then, when there is a fault generated in the electrode terminal 24 out of the electrode terminals 24 and 25 used normally, a voltage is applied between the electrode terminal 25 and the electrode terminal 26 that is provided for the case of having a fault, i.e., between the transparent electrode 44 and the transparent electrode 48a, to give a potential difference to the transparent-scattering changing element 40C for driving it. The transparent electrode 48a is assumed to be used also as a resistor, as will be described later. Therefore, the transparent electrode 48a is a patterned electrode, and space between the patterns is formed extremely narrow. Thus, the transparent electrode 48a can be used as the electrode for changing transparent and scattering states while causing almost no deterioration in the transparent-scattering changing performance.

Further, when there is a fault generated in the electrode terminal 25 out of the electrode terminals 24 and 25 used normally, a voltage is applied between the electrode terminal 26 and the electrode terminal 27 provided for driving the transparent heater, i.e., between the two electrode terminals 26 and 27 provided to the transparent electrode 48a, to supply power. Further, the transparent electrode 48a is used as the resistor of the transparent heater to heat the transparent-scattering changing element 40C.

As in the case of the transparent electrode 53 shown in the first exemplary embodiment, the transparent electrode 48a is formed to be in a narrow line width for increasing the resistance value of the transparent electrode 48a. At the same time, the transparent electrode 48a is patterned to provide a long distance between the electrode terminals, i.e., between the electrode terminal 26 and the electrode terminal 27, as much as possible. Therefore, it is possible to generate heat by supplying an electric current to the transparent electrode 48a via a pair of the electrode terminals 26 and 27 from the power supply source, so that the transparent electrode 48a can function as a heater. Further, it is also possible to form the transparent electrode 48a into a thin film or to increase the oxygen content in order to increase the resistance value of the transparent electrode 48a.

Which one of the electrode terminals 24 and 25 is having a fault can be judged by using the electric current detection element 70B that is connected to the electrode terminal 26. For example, a voltage is applied between the electrode terminals 24 and 25 used under a normal operation to drive the transparent-scattering changing element 40C. When there is a fault generated in the transparent-scattering changing element 40C, application of the voltage between the electrode terminals 24 and 25 is stopped. Then, a voltage is applied between the electrode terminal 25 and the electrode terminal 26 to drive the transparent-scattering changing element 40C, the electric current value flown into the transparent-scattering changing element 40C at that time is measured by the electric current detection element 70B, and it is judged by the fault judging module 75 whether or not there is a fault being generated based on the measured electric current value.

When it is found as a result of judgment that there is a fault, it can be judged that there is a fault generated in the electrode terminal 25. In the meantime, when it is found as a result of judgment that there is no fault, it can be judged that there is a fault generated in the electrode terminal 24. In a case where there is a fault generated in the electrode terminal 25, the transparent-scattering changing element 40C is heated in the manner described above by using the electrode terminal 26 and the electrode terminal 27. In a case where there is a fault generated in the electrode terminal 24, the transparent-scattering changing element 40C is driven by keeping the use of the electrode terminal 25 and the electrode terminal 26.

Further, while it is described above to drive the transparent-scattering changing element 40C by applying a voltage thereto by using the electrode terminal 25 and the electrode terminal 26 when there is a fault generated in the electrode terminal 24, it is also possible to heat the transparent-scattering changing element 40C by utilizing the electrode terminal 26 and the electrode terminal 27 without using the electrode terminal 25 (without giving a voltage difference to the transparent-scattering changing element 40C).

Through the operation processing described above, the transmittance can be increased by increasing the normal light refractive index of the liquid crystal to reduce the difference between the refractive index of the liquid crystal and the refractive index of the polymer when there is a fault. This makes it possible to turn the transparent-scattering changing element 40C to a transparent state and set the image display device 1 to a narrow vision display state forcibly. Thereby, it is possible to prevent leakage of the information on the display screen.

Other structures and operation effects thereof are the same as those of the case of the second exemplary embodiment described above.

Fifth Exemplary Embodiment

Next, a fifth exemplary embodiment of the image display device according to the present invention will be described by referring to FIG. 14 and FIG. 15. Note here that same reference numerals are applied to the same structural members as those of the first exemplary embodiment described above.

As shown in FIG. 14, an image display device 3 according to the fifth exemplary embodiment is formed by including: a backlight 10; a transparent heater 50 having a heating function, which is provided on the upper side of the backlight 10; a retardation control liquid crystal cell (viewing angle changing element) 80 for electrically changing the viewing angle range, which is provided on the upper side of the transparent heater 50; and a non-luminance type display element 60 provided on the upper side of the retardation control liquid crystal cell 80.

The structure including the backlight 10, the transparent heater 50, the viewing angle changing element 80, and the display element 60 is the same as that of the image display device 1 of the first exemplary embodiment shown in FIG. 1. However, the image display device 3 according to the fifth exemplary embodiment is different from the image display device 1 according to the first exemplary embodiment in respect that the viewing angle changing element 80 is formed by the retardation control liquid crystal cell.

The members under the same reference numerals as those of the image display device 1 according to the first exemplary embodiment shown in FIG. 1 have the same functions. While not shown in FIG. 14, also provided are an electric current detection element (operation state detection element) 70A (see FIG. 15) for monitoring the state of the retardation control liquid crystal cell 80 and a fault judging module 75 (see FIG. 15) for judging whether or not there is a fault generated in the viewing angle changing element 80 based on the measurement value detected by the electric current detection element 70A.

As shown in FIG. 14, the retardation control liquid crystal cell 80 includes a pair of transparent substrates 83 and 85, and a liquid crystal 84 aligned homogeneously is sandwiched between those transparent substrates. The homogeneous alignment is a state of alignment in which the major axis direction of the liquid crystal molecule group sandwiched between the transparent substrates 83 and 85 is in parallel to the faces of the transparent substrates 83 and 85. Further, while not shown in FIG. 14, transparent electrodes 88, 89 (see FIG. 15) are loaded to the transparent substrates 83, 85, respectively. Furthermore, at least retardation plates 82, 86 for compensating the phase of the liquid crystal and polarization plates 81, 87 are provided on the outside of the both transparent substrates 83, 85.

While the two polarization plates 81, 87 on top and bottom are used for the retardation control liquid crystal cell 80 in the form shown in FIG. 14, it is not limited only to that. A polarization plate 61 of the display element 60 neighboring to the retardation control liquid crystal cell 80 may be used as the polarization plate of the retardation control liquid crystal cell 80, for example. Thereby, the number of polarization plates used for the image display device 3 can be decreased, so that it is possible to reduce the thickness of the image display device 3.

With such structure, the alignment state of the sandwiched liquid crystal molecules can be changed by applying a voltage between the transparent electrodes 88, 89 loaded to the transparent substrates 83, 85, so that the birefringence amount of the liquid crystal can be adjusted. Further, the viewing angle property of the emission light can be changed through adjusting the birefringence amount, thereby making it possible to change the wide vision display and the narrow vision display of the image display device. When a voltage is applied between the transparent substrates 83 and 85, the birefringence amount of the liquid crystal is decreased. Thus, the viewing angle of the emission light from the retardation control liquid crystal cell 80 becomes narrow. As a result, the display of the image display device 3 is set to a narrow vision display state.

A fault in changing the viewing angle of the image display device 3 according to the fifth exemplary embodiment is generated in accordance with a fault generated in the retardation control liquid crystal cell 80. The retardation control liquid crystal cell 80 also uses a liquid crystal. Thus, when the birefringence retardation of the liquid crystal becomes decreased by heating and the temperature becomes high, the phase is turned to an isotropic phase. Therefore, the birefringence retardation of the liquid crystal layer can be adjusted without applying a voltage, through heating the liquid crystal in the manner described above. As a result, it is possible to forcibly set the image display device to a narrow vision display by operating the transparent heater 50 through supplying the power thereto from a power supply circuit (by using a narrow vision forcible setting module formed with the transparent heater and the power supply circuit) when there is a fault. As a result, it is possible to prevent leakage of the information displayed on the display screen.

Next, FIG. 15 shows a drive control system of the image display device 3 according to the fifth exemplary embodiment.

The operation of the image display device 3 is controlled by a control module (e.g., CPU) 17. Note here that a power supply switch 16 connected to the control module 17, the backlight 10, the forcible heating mechanism 50, the display element 60, the electric current detection element 70A, and the fault judging module 75 have the same functions as the respective members under the same reference numerals of the image display device 1 described in the first exemplary embodiment.

As a difference with respect to the drive control system of the first exemplary embodiment, the retardation control liquid crystal cell 80 is provided to the drive control system of the fifth exemplary embodiment as the viewing angel changing element.

Illuminating the display element 60 under controls of the control module 17 at the rise of the power upon an on-operation of the power supply switch 16, setting of the wide vision display state when the device is not being used, setting of the narrow vision display when the device is being used, etc., are same as the processing setting described in the first exemplary embodiment. In the fifth exemplary embodiment, a voltage is applied to the voltage applying electrodes (transparent electrodes) 88 and 89 when changing to a narrow vision display.

The electric current flown into the retardation control liquid crystal cell 80 is detected by the electric current detection element 70A, and the detected electric current value is sent to the fault judging module 75. Electric current values (electric current values under a normal operation) flowing into the retardation control liquid crystal cell 80 for a wide vision display and a narrow vision display are stored in advance to the fault judging module 75. The fault judging module 75 compares the drive electric current value of the retardation control liquid crystal cell 80 detected by the electric current detection element 70A with the stored electric current values, and judges whether or not there is a fault generated in the retardation control liquid crystal cell 80. The judgment result is transmitted to the control module 17. When it is judged as a result of judgment that there is a fault, the control module 17 stops supply of the voltage to the transparent electrodes 88, 89, and heats the retardation control liquid crystal cell 80 by operating the forcible heating mechanism 50 to perform a control for forcibly changing the display of the image outputted from the display element 60 of the image display device 3 to a narrow vision display state. Through setting the alignment of the liquid crystal to an isotropic alignment through decreasing the birefringence retardation of the liquid crystal layer 84 by heating the retardation control liquid crystal cell 80, the image display device 3 can be set to a narrow vision display state without applying a voltage to the retardation control liquid crystal cell 80.

Other structures and operation effects thereof are the same as those of the case of the first exemplary embodiment described above.

Sixth Exemplary Embodiment

Next, a sixth exemplary embodiment of the image display device according to the present invention will be described by referring to FIG. 16.

As shown in FIG. 16, an image display device 4 according to the sixth exemplary embodiment is formed by including: a backlight 10; a retardation control liquid crystal cell (viewing angle changing element) 80 for electrically changing the viewing angle range, which is provided on the upper side of the backlight 10; and a non-luminance type display element 60 provided on the upper side of the retardation control liquid crystal cell 80. That is, the image display device 4 is different from the image display device 2 of the second exemplary embodiment in respect that the same retardation control liquid crystal cell 80 as that of the image display device 3 of the fifth exemplary embodiment shown in FIG. 14 is used instead of the viewing angle changing element 20 of the image display device 2 according to the second exemplary embodiment shown in FIG. 8.

In the image display device 4 according to the sixth exemplary embodiment, the members under the same reference numerals as those of the respective members of the image display device 2 described in the second exemplary embodiment have the same functions and exhibit the same operational effects. Further, the retardation control liquid crystal cell 80 has the same functions and exhibits the same operational effects as those of the retardation control liquid crystal cell 80 used in the fifth exemplary embodiment. In a case where there is a fault generated in the retardation control liquid crystal cell 80, the image display device 4 having such structure can detect the fault instantly. Therefore, it is possible to prevent the use of the device remained in a fault state, so that leakage of the information displayed on the display screen can be prevented. Other structures and operation effects thereof are the same as those of the case of the second exemplary embodiment described above.

Seventh Exemplary Embodiment

Next, a seventh exemplary embodiment of the image display device according to the present invention will be described by referring to FIG. 17.

Like the structure of the image display device 1 according to the first exemplary embodiment of the present invention, an image display device 5 according to the seventh exemplary embodiment is formed by including: a backlight 10; a viewing angle changing element 20; a transparent heater 50; and a display element 60. However, the image display device 5 according to the seventh exemplary embodiment includes an input device 90 on the upper side of the display element 60, as shown in FIG. 17. In this respect, the image display device 5 is different from the image display device 1 of the first exemplary embodiment. The input device 90 is formed with an input unit 91 and a frame 92. The input device 90 may be of any types such as a resistance type, an electrostatic induction type, an infrared ray type, etc., as long as it is a type capable of recognizing the display image of the image display device 5.

In addition to those, the image display device 5 also includes an electric current detection element 70A for monitoring the state of the viewing angle changing element 20 and a fault judging module 75 for judging whether or not there is a fault generated in the viewing angle changing element 20 based on the measurement value detected by the detection element, as in the case of the image display device 1 of the first exemplary embodiment. Each of the structural members of the image display device 5 under same reference numerals as those of the respective structural members constituting the image display device 1 of the first exemplary embodiment has the same functions and exhibits the same operations and effects.

Through having such structure, it is possible with the seventh exemplary embodiment to achieve the image display device 5 to which the input function is provided. Further, even when there is a fault generated in the transparent-scattering changing element 40 of the viewing angle changing element 20, it is possible to detect the occurrence of the fault instantly and to set the transparent-scattering changing element 40 to a transparent state by heating it. Thus, the image display device 5 can be forcibly set to a narrow vision display, so that leakage of the user information inputted via the input device 90 can be prevented.

Other structures and operation effects thereof are the same as those of the case of the first exemplary embodiment described above.

Eighth Exemplary Embodiment

Next, an eighth exemplary embodiment of the image display device according to the present invention will be described by referring to FIG. 18-FIG. 21. Note here that same reference numerals are applied to the same structural members as those of the first exemplary embodiment described above.

As shown in FIG. 18, an image display device 6 according to the eighth exemplary embodiment is formed by disposing a photosensor element (operation state detection element) 70C constituted with an optical sensor 71 having a light-ray direction control element (oblique louver) 72 on the surface (the upper side of the non-luminance type display element 60) of the image display device 1 of the first exemplary embodiment shown in FIG. 1. The members under the same reference numerals as those of the members of the image display device 1 of the first exemplary embodiment shown in FIG. 1 have the same functions and exhibit the same operational effects.

As shown in FIG. 18, the photosensor element 70C is formed by having the light-ray direction control element 72 such as an oblique louver provided to the optical sensor 71 such as a photodiode. With the use of the photosensor element (oblique direction photosensor) 70C formed by the optical sensor 71 having the oblique louver 72 loaded thereon, the amount of oblique light emitted from the display element 60 can be monitored.

Figure 19A:
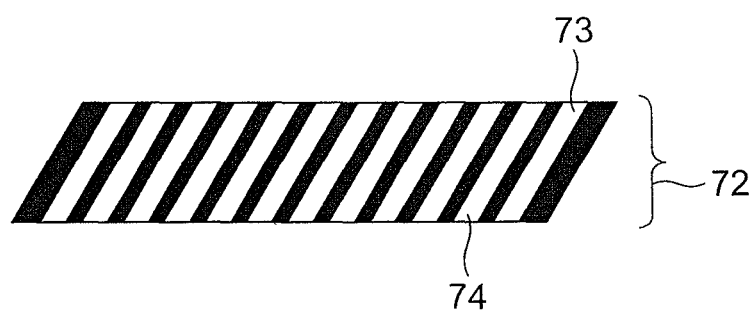
Figure 19B:
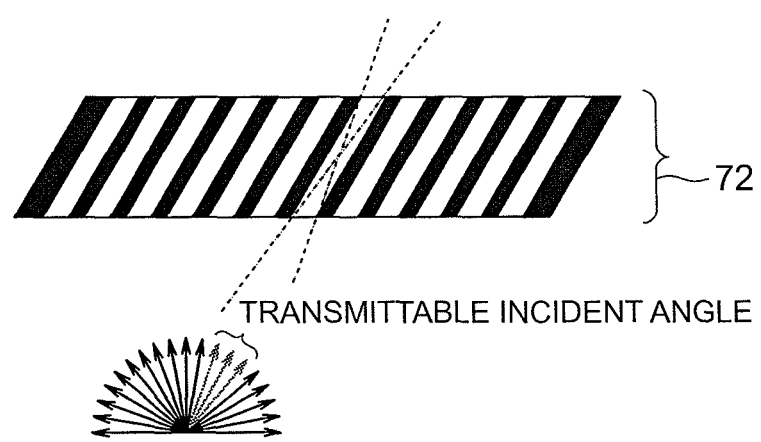

In the section of the oblique louver 72, a transparent layer 73 and a light shielding layer 74 are arranged alternately and in parallel as shown in FIG. 19A, and those layers are tilted with respect to the thickness direction (the vertical direction of the drawing) of the oblique louver 72. Through adjusting the tilt angle, it is possible to control the transmittable incident angles, as shown in FIG. 19B.

Figure 20:
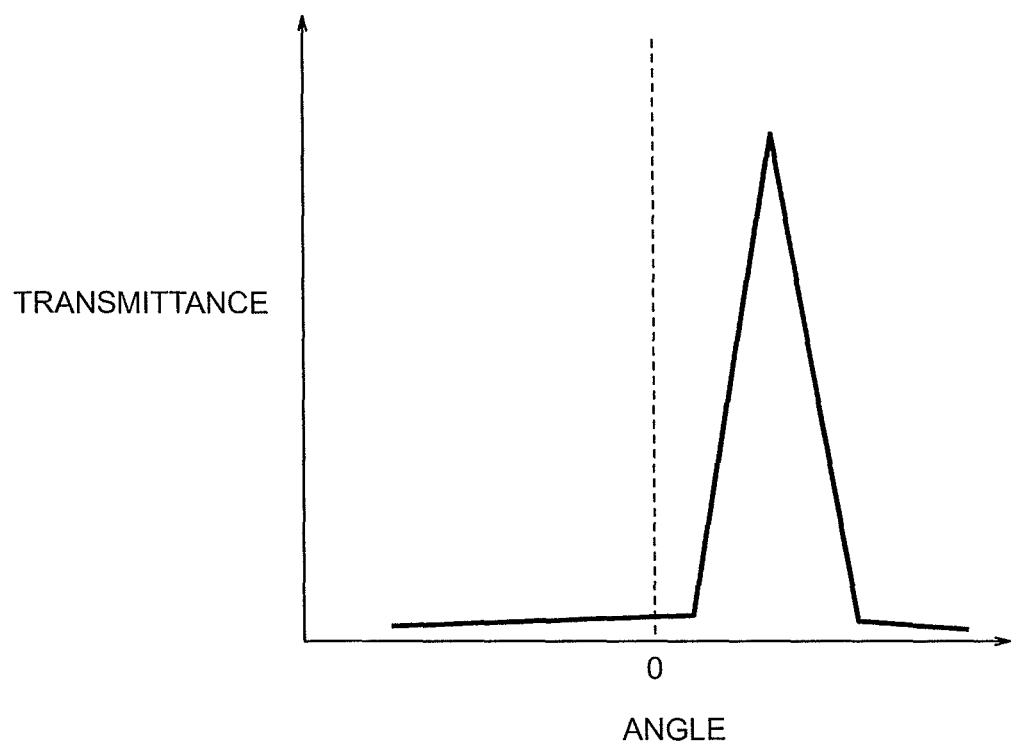
FIG. 20 is a graph showing changes of the transmittance with respect to the angles of incident light of the oblique louver shown in FIG. 18.

With such structure, the photosensor element (oblique direction photosensor) 70C exhibits the transmittance property for the incident light as shown in FIG. 20. Light making incident on the photosensor element 70C in the perpendicular direction (at an angle of 0 degree) is absorbed by the light shielding layer 74 and cannot transmit therethrough when passing the oblique louver 72, and only light making incident on the photosensor element 70C in the oblique direction can transmit. As described, the photosensor element 70C blocks the light from the front direction (perpendicular direction) and transmits only the light from the oblique direction. Therefore, the photosensor element 70C can detect the luminance change in the oblique direction of the image display device 6 when changing the viewing angles, so that it is possible to discriminate the narrow vision display or the wide vision display of the image display device 6.

The photosensor element 70C is desired to be placed in the corner of the display section of the non-luminous type display element 60. Since the transmittable incident angles can be controlled by adjusting the tilt angle as described above, the photosensor element can be placed on the outside of the display section by setting the tilt angle still greater.

This makes it possible to detect a fault in changing of the viewing angle without blocking the display region (displayed information) of the display element 60. Further, while the oblique louver 72 is loaded to the optical sensor 71 herein, it is not limited only to the oblique louver 72 as long as it is an element which detects the light in the oblique direction. Furthermore, while a photodiode is used as the optical sensor 71 herein as a way of example, the optical sensor is not limited only to that as long as it is an element which can detect the light amount.

As described, by employing the structure in which the photosensor element 70C is placed on the upper side of the non-luminous display element 60, it is possible to judge an occurrence of a fault through detecting the luminance of the image display device 6 in all of the fault modes (the fault modes 1-4 described in the first exemplary embodiment).

For example, in the fault modes 1, 2, and 3, the transparent-scattering changing element 40 turns to a scattering state because of a fault when the display of the image display device 6 is supposed to be a narrow vision display, and the luminance becomes higher than the luminance set value of a normal operation for the narrow vision display measured in advance. Particularly, in the fault modes 2 and 3, a voltage cannot be applied to the transparent-scattering changing element 40. Therefore, the luminance becomes higher than the case of the fault mode 1.

Further, an overvoltage is applied in the fault mode 4, so that the image display device 6 is fixed to a narrow vision display state. Thus, even when a control signal for changing to a wide vision display is received, the transparent-scattering changing element 40 does not change but stays in a transparent state. As a result, the luminance detected by the photosensor element 70C becomes lower than the luminance set value of a normal operation for the wide vision display measured in advance. Therefore, it is possible to detect the fault based on the comparison result of the detected luminance values.

Next, the viewing angle changing processing operation of the image display device 6 will be described.

Figure 21:
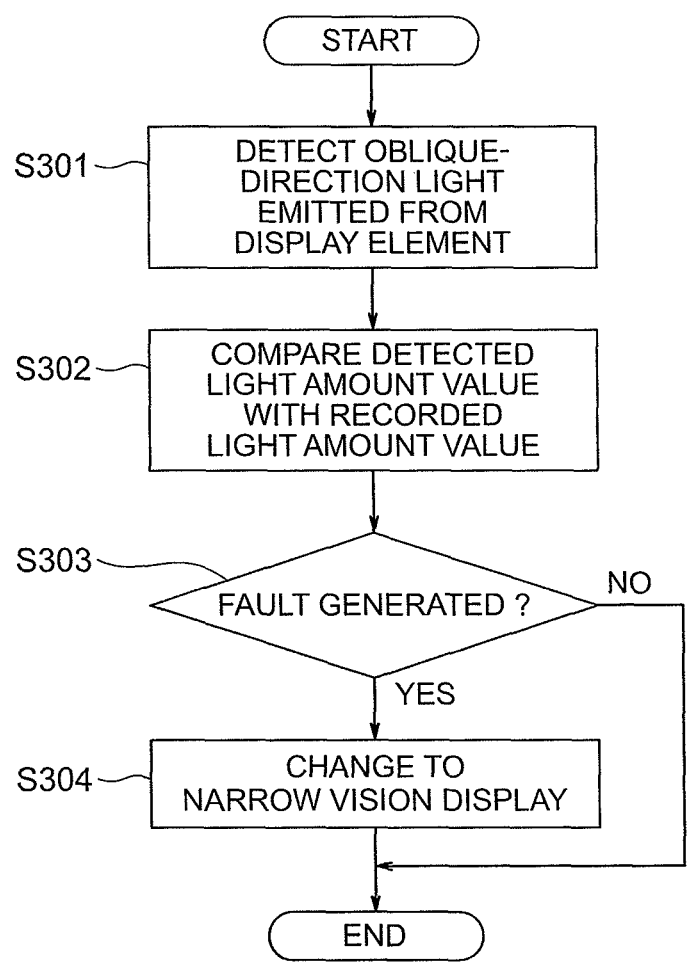
FIG. 21 is a flowchart showing a viewing angle changing processing operation of the image display device shown in FIG. 18.

First, as shown in a flowchart of FIG. 21, light of the oblique direction out of the light emitted from the display element 60 is detected and measured by the photosensor element 70C placed on the upper side of the non-luminance type display element 60 (step S301). The measured luminance value is sent to the fault judging module 75.

Desired light amounts (luminance values) for the wide vision display and the narrow vision display under a normal operation of the image display device 6 are measured by the photosensor element 70C in advance, and the measured values (luminance reference values) are stored in the fault judging module 75 that is provided inside the image display device 6. The fault judging module 75 compares the stored luminance reference values for the wide vision display and the narrow vision display with the luminance value detected by the photosensor element 70C (step S302).

Then, it is judged whether or not there is a fault generated in the viewing angle changing element 20 based on the comparison result (step S303). Specifically, in a case where the difference between the measured light amount and the pre-stored light amount under a normal operation is within a prescribed range specified in advance (e.g., within ±10% of the normal operation light amount value), it is judged that there is no fault being generated in the viewing angle changing element 20. When the difference is out of the prescribed range, it is judged that there is a fault being generated.

When it is found as a result of judgment that there is no fault generated in the viewing angle changing element 20, the processing operation is ended. In the meantime, when there is a fault generated in the viewing angle changing element 20, the display of the image outputted from the display element 60 is forcibly changed to the narrow vision display by the changing module (50) (step S304). In a case where the transparent-scattering changing element 40 is electrically changed to a scattering state and the image display device 6 is set to a wide vision display state due to a fault generated in the viewing angle changing element 20, a risk of having the information (a secret code number, etc., of the user) displayed on the screen of the image display device 6 leaked to the other users in the surrounding is increased. Thus, the viewing angle changing element 20 (transparent-scattering changing element 40) is heated by operating the forcible heating mechanism (transparent heater) 50. Through heating, it is possible to turn the transparent-scattering changing element 40 to a transparent state and to forcibly change the display of the image display device 6 to a narrow vision display state. As a result, leakage of the user information can be prevented.

The image display device 6 can also be operated as follows.

The stored luminance values of each of the display states are compared with the detected luminance value to judge whether or not there is a fault generated in the viewing angle changing element 20 in the same manner as the operation steps described above. When judged that there is a fault, the electrode terminals (voltage forcible applying mechanism) for the case of a fault provided to the transparent-scattering changing element 40 is operated as a drive source of the transparent-scattering changing element 40. This makes it possible to drive the transparent-scattering changing element 40, even when there is a fault generated in the viewing angle changing element 20. Therefore, the image display device 6 can be forcibly changed to the narrow vision display, and leakage of the information displayed on the display screen can also be prevented even at the time of having a fault.

With the eighth exemplary embodiment, it is possible to detect the light of the oblique direction with a limited space by loading the light-ray direction control element 72 to the optical sensor 71 which monitors the viewing angle changing element 20. Thus, a fault generated in the viewing angle changing element 20 can be detected easily. Further, when it is judged that there is a fault, the image display device can be set to the narrow vision display forcibly, so that leakage of the information on the screen can be prevented.

Other structures and operation effects thereof are the same as those of the case of the first exemplary embodiment described above.

Ninth Exemplary Embodiment

Next, a ninth exemplary embodiment of the image display device according to the present invention will be described by referring to FIG. 22.

Figure 22:
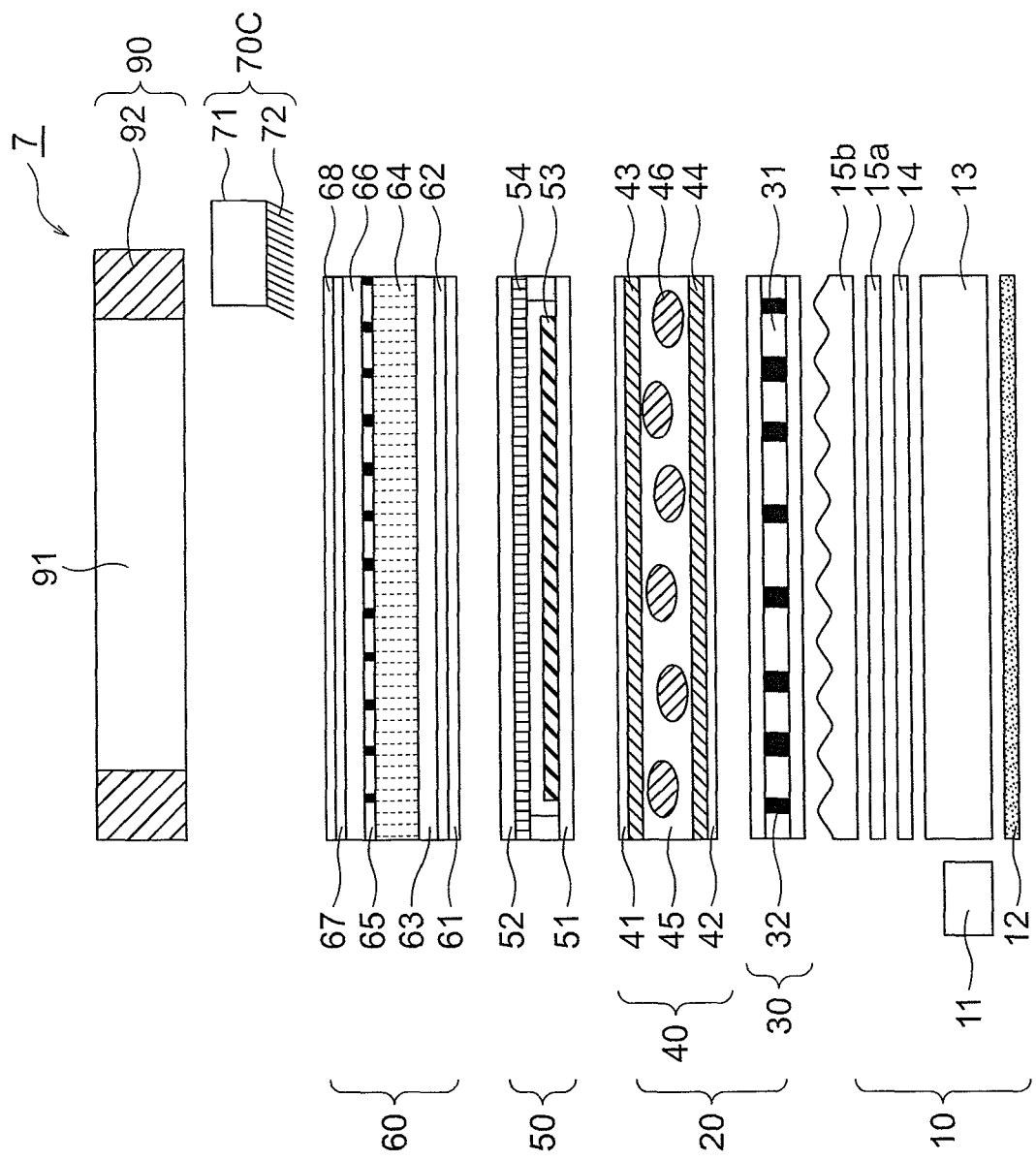
FIG. 22 is a sectional view showing a ninth exemplary embodiment of the image display device according to the present invention.

As shown in FIG. 22, an image display device 7 according to the ninth exemplary embodiment of the present invention is characterized to have an input device 90 that is equivalent to the input device 90 of the seventh exemplary embodiment (see FIG. 17), which is provided on the image output face (on the upper side of the photosensor (operation state detection element) 70C) of the image display device 6 of the eighth exemplary embodiment (FIG. 18) described above.

In the image display device 7 according to the ninth exemplary embodiment, each of the structural members under same reference numerals as those of the respective structural members constituting the image display device 6 of the eighth exemplary embodiment has the same functions and exhibits the same operational effects. Further, the input device 90 has the same functions and exhibits the same operational effects as those of the input device 90 used in the seventh exemplary embodiment.

Through having such structure, it is possible with the ninth exemplary embodiment to achieve the image display device 7 to which the input function is provided. Further, through placing the input device 90 on the surface of the image display device 7, the photosensor element 70C placed on the display element 60 can be housed under the frame 92 of the input device 90. This makes it possible to overcome a sense of visually uncomfortable feeling felt by observers because the photosensor element 70C is reflected inside the display screen. Further, since the photosensor element 70C is not visually recognized by the observers, restriction in terms of design as the image display device with the input device can be eased greatly. Furthermore, even when there is a fault generated in the transparent-scattering changing element 40 of the viewing angle changing element 20, the occurrence of the fault can be detected instantly and the transparent-scattering changing element 40 is set to a transparent state by heating. Thus, the image display device 7 can be set to a narrow vision display forcibly, so that leakage of the user information inputted via the input device 90 can be prevented.

Other structures and operation effects thereof are the same as those of the case of the eighth exemplary embodiment described above.

Tenth Exemplary Embodiment

Figure 23:
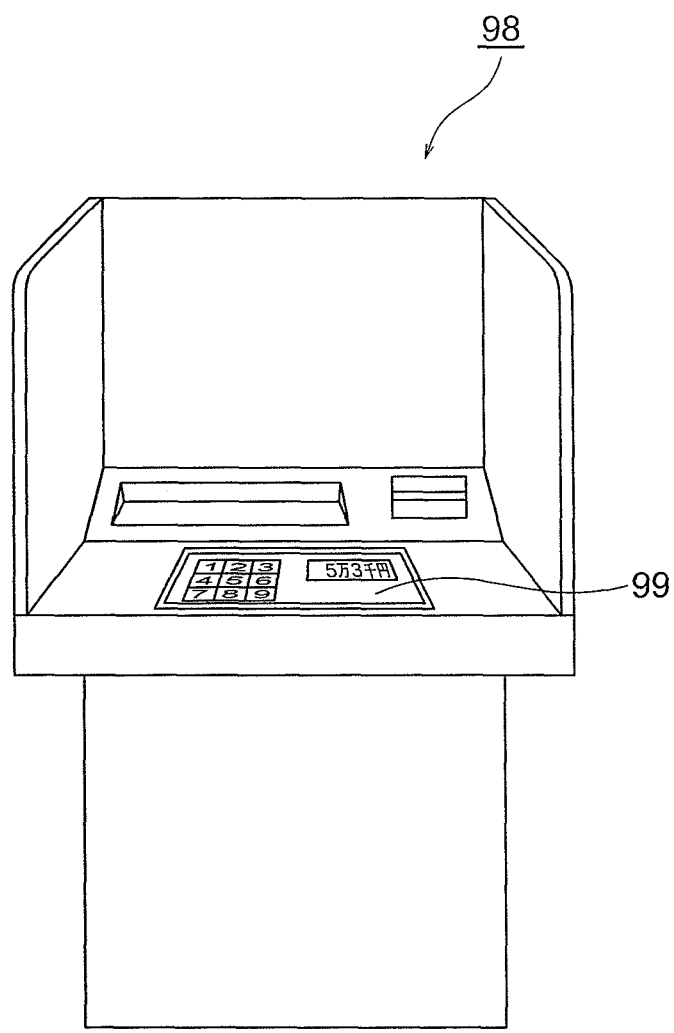
FIG. 23 is a perspective view showing an electronic apparatus on which the image display device according to the present invention is loaded.
Figure 24:
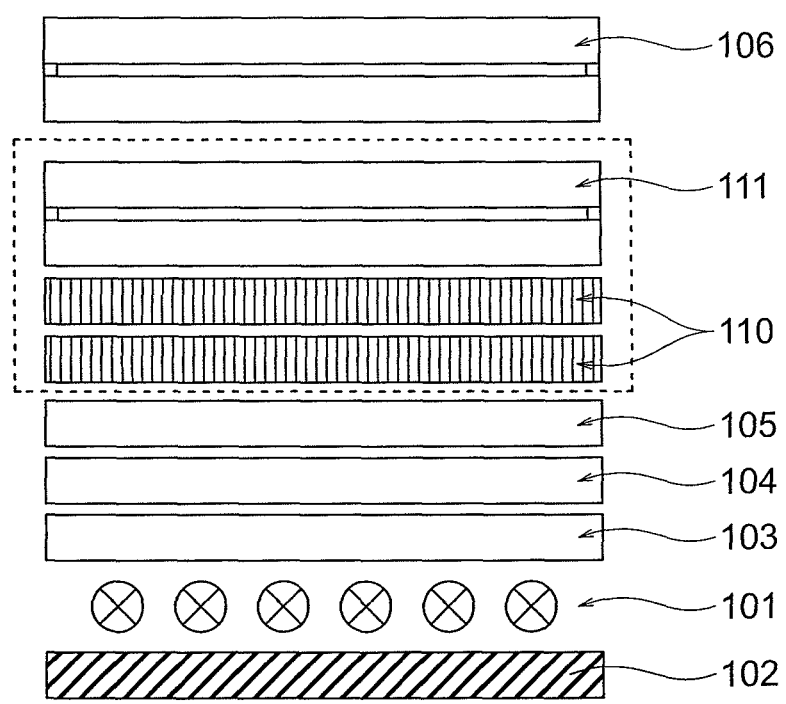
FIG. 24 is a sectional view showing a structure of a variable viewing angle display of a related technique.

Next, a tenth exemplary embodiment of the image display device according to the present invention will be described by referring to FIG. 23.

An image display device of the tenth exemplary embodiment is characterized to be loaded on an electronic apparatus. As shown in FIG. 23, an image display device 99 is loaded on an ATM (electronic apparatus) 98 that is placed at a bank or a convenience store, for example. The user can deposit and withdraw money by operating the display screen (e.g., a touch panel screen) of the image display device 99. As the image display device 99 loaded on the electronic apparatus 98, the image display devices according to the first to ninth exemplary embodiments can be used, for example.

Even when the image display devices of the first to ninth exemplary embodiments described above are loaded on the ATM (electronic apparatus) 98, each of the image display devices can exhibit the same operational effects as those depicted in the respective embodiments. Thus, the electronic apparatus 98 can forcibly set the display of the image outputted from the display element to a narrow vision display state even when there is a fault generated in the viewing angle changing element of the image display device that is loaded on the electronic apparatus. Therefore, it is possible to securely prevent leakage of the user information displayed on the display screen.

While the present invention has been described by referring to some of the exemplary embodiments, the image display device and the electronic apparatus using the same are not limited only to those exemplary embodiments. It is to be noted that the present invention includes the image display device and the electronic apparatus achieved by applying various kinds of modifications and changes to the structures of the exemplary embodiments described above.

A part of or a whole part of the functions (contents) executed by each of the structural members of the image display devices of each of the above-described exemplary embodiments may be built as a program to have it executed by a computer. Even in such case, the same effects as those of the exemplary embodiments can be achieved.

The new technical contents of each of the above-described exemplary embodiments can be summarized as follows. While a part or a whole part of the exemplary embodiments can be depicted as follows, it is to be noted that the present invention is not necessarily limited to those depicted below.

(Supplementary Note 1)

An image display device, including a display device main body which includes a display element for outputting/displaying prescribed image information to outside and a viewing angle changing element for setting to change outputted display of image information on the display element at least from a wide vision display to a narrow vision display based on a changing command from the outside, wherein: the display device main body is provided with an operation state detection element which detects an operation state of the viewing angle changing element; and the viewing angle changing element is provided with a narrow vision forcible setting module which operates to forcibly set the outputted display of the display element to a narrow vision display state, when the operation state detected by the operation state detection element is a fault state.

(Supplementary Note 2)

The image display device depicted in Supplementary Note 1, wherein the narrow vision forcible setting module is formed by a forcible heating mechanism which heats the viewing angle changing element.

(Supplementary Note 3)

The image display device depicted in Supplementary Note 1, wherein the narrow vision forcible setting module is a voltage forcible applying mechanism which applies a voltage to the viewing angle changing element.

(Supplementary Note 4)

The image display device depicted in Supplementary Note 2, wherein the forcible heating mechanism is formed by a transparent heater made with a transparent electrode and a power supply circuit which supplies power to the transparent heater.

(Supplementary Note 5)

The image display device depicted in Supplementary Note 3, wherein the voltage forcible applying mechanism is formed by a pair of transparent electrodes covered by an insulating layer and insulated from a voltage applying electrode that is used under a normal state where no fault is generated.

(Supplementary Note 6)

The image display device depicted in Supplementary Note 3, wherein the voltage forcible applying mechanism includes another voltage supplying terminal that is independent from a terminal for supplying a voltage used under a normal state where no fault is generated.

(Supplementary Note 7)

The image display device depicted in any one of Supplementary Notes 1-6, which includes a fault judging module, wherein: the operation state detection element is formed by an oblique direction photosensor provided at an end of an output display face side of the display element for detecting light outputted in oblique directions from the output display face; and the fault judging module judges whether or not there is a fault generated in the viewing angle changing element based on a light detected value acquired by the oblique direction photosensor.

(Supplementary Note 8)

The image display device depicted in Supplementary Note 7, wherein the oblique direction photosensor is formed by a normal photosensor and a light-ray direction control element provided on a light-receiving face of the oblique direction photosensor.

(Supplementary Note 9)

The image display device depicted in any one of Supplementary Notes 1-6, which includes a fault judging module, wherein: the operation state detection element is formed by an electric current detection element which measures an electric current flown in the viewing angle changing element; and the fault judging module judges whether or not there is a fault generated in the viewing angle changing element based on an electric current detected value acquired by the electric current detection element.

(Supplementary Note 10)

The image display device depicted in any one of Supplementary Notes 1-9, which includes an input device made with a transparent member for inputting information which is provided on an image information output/display side of the display device main body.
(Supplementary Note 11)
An electronic apparatus, including the image display device depicted in any one of Supplementary Notes 1-10 loaded for displaying information.
(Supplementary Note 12)
A display output control method used for an image display device including a display device main body which includes a display element for outputting/displaying prescribed image information to outside and a viewing angle changing element for setting to change outputted display of image information on the display element at least from a wide vision display to a narrow vision display based on a changing command from the outside, and the method includes: detecting an electric current flowing into the viewing angle changing element by an electric current detection element provided to the display device main body; executing comparison processing for comparing the electric current value detected by the electric current detection element with an electric current value under a normal operation measured and stored in advance, and judgment processing by a fault judging module provided to the display device main body for judging whether or not there is a fault generated in the viewing angle changing element based on a result of the comparison; and setting the output display of the display element to a narrow vision display state forcibly by a narrow vision forcible setting module that is provided to the viewing angle changing element, when it is judged by the fault judging module that there is a fault.
(Supplementary Note 13)
The display output control method for the image display device depicted in Supplementary Note 12, wherein the narrow vision forcible setting module forcibly sets the outputted display of the display element to a narrow vision display state by heating the viewing angle changing element, when it is judged by the fault judging module that there is a fault.
(Supplementary Note 14)
The display output control method for the image display device depicted in Supplementary Note 12, wherein, in a case where the narrow vision forcible setting module is a voltage applying electrode used exclusively for the time of having a fault provided separately from a voltage applying electrode used under a normal state where no fault is generated, the outputted display of the display element is forcibly set to a narrow vision display state through applying a voltage to the viewing angle changing element by the voltage applying electrode used exclusively for the time of having a fault, when it is judged by the fault judging module that there is a fault.
(Supplementary Note 15)
A display output control program used for an image display device including a display device main body which includes a display element for outputting/displaying prescribed information to outside and a viewing angle changing element for setting to change outputted display of image information on the display element at least from a wide vision display to a narrow vision display based on a changing command from the outside, and the program causes a computer to execute: a fault judgment processing function which compares an electric current value detected by an electric current value detection element for detecting a drive electric current for the viewing angle changing element with an electric current value under a normal operation stored in advance, and judges whether or not there is a fault generated in the viewing angle changing element based on a result of the comparison; and a narrow vision forcible changing function which forcibly sets the display of the display element to a narrow vision display state, when it is judged by the fault judgment processing function that there is a fault.

INDUSTRIAL APPLICABILITY

The present invention can be utilized as the display device of industrial information terminals such as ATMs and mobile information terminals such as mobile telephones and notebook personal computers.

What is claimed is:
1. An image display device, comprising:
a display device main body which includes a display element for displaying prescribed image information to outside and a viewing angle changing element for setting to change outputted display of image information on the display element at least from a wide vision display to a narrow vision display based on a changing command from the outside, wherein:
the display device main body is provided with an operation state detection element which detects an operation state of the viewing angle changing element based on an electric current flowing in the viewing angle changing element; and
a fault judging module which compares an electric current value detected by the operation state detection element with an electric current value under a normal operation measured and stored in advance and, judges whether or not there is a fault generated in the viewing angle changing element based on a result of the comparison, wherein
the viewing angle changing element is provided with a narrow vision forcible setting module which operates when it is judged by the fault judging module that there is a fault, and forcibly sets the outputted display of the display element to a narrow vision display state, wherein
the narrow vision forcible setting module is formed by a forcible heating mechanism which heats the viewing angle changing element, and wherein
when it is judged by the fault judging module that there is a fault generated in the viewing changing element, the electric current flowing in the viewing angle changing element is stopped and the forcible heating mechanism heats the viewing changing element, and
when it is judged by the fault judging module that there is not a fault generated in the viewing changing element, the electric current flowing in the viewing angle changing elements is not stopped.
2. The image display device as claimed in claim 1, wherein the forcible heating mechanism is formed by a transparent heater made with a transparent electrode and a power supply circuit which supplies power to the transparent heater.
3. An electronic apparatus, comprising the image display device as claimed in claim 1 loaded for displaying information.
4. A display output control method used for an image display device comprising a display device main body which includes a display element for displaying prescribed image information to outside and a viewing angle changing element for setting to change outputted display of image information on the display element at least from a wide vision display to a narrow vision display based on a changing command from the outside, the method comprising:
detecting an electric current flowing into the viewing angle changing element by an electric current detection element provided to the display device main body;

executing comparison processing for comparing the electric current value detected by the electric current detection element with an electric current value under a normal operation measured and stored in advance, and judgment processing by a fault judging module provided to the display device main body for judging whether or not there is a fault generated in the viewing angle changing element based on a result of the comparison; and setting the output display of the display element to a narrow vision display state forcibly by a narrow vision forcible setting module that is provided to the viewing angle changing element, when it is judged by the fault judging module that there is a fault, wherein the narrow vision forcible setting module is formed by a forcible heating mechanism which heats the viewing angle changing element, and wherein when it is judged by the fault judging module that there is a fault generated in the viewing changing element, the electric current flowing in the viewing angle changing element is stopped and the forcible heating mechanism heats the viewing changing element, and when it is judged by the fault judging module that there is not a fault generated in the viewing changing element, the electric current flowing in the viewing angle changing element is not stopped.

5. The image display device as claimed in claim 1, wherein the viewing angle changing element judges whether or not a fault classified into a plurality of modes is generated in the viewing angle changing element based on a level of an electric current value detected by an electric current detection element.

\* \* \* \* \*